US008653991B2

(12) United States Patent
Harada et al.

(10) Patent No.: US 8,653,991 B2
(45) Date of Patent: Feb. 18, 2014

(54) CODING METHOD, DECODING METHOD, AND APPARATUSES, PROGRAMS AND RECORDING MEDIA THEREFOR

(75) Inventors: Noboru Harada, Tokyo (JP); Takehiro Moriya, Tokyo (JP); Yutaka Kamamoto, Tokyo (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 326 days.

(21) Appl. No.: 13/194,549

(22) Filed: Jul. 29, 2011

(65) Prior Publication Data

US 2011/0282657 A1 Nov. 17, 2011

Related U.S. Application Data

(62) Division of application No. 12/746,275, filed as application No. PCT/JP2008/072513 on Dec. 11, 2008, now Pat. No. 8,068,042.

(30) Foreign Application Priority Data

Dec. 11, 2007 (JP) ................................ 2007-319805

(51) Int. Cl.
*H03M 7/00* (2006.01)

(52) U.S. Cl.
USPC ............................................... 341/50; 341/51

(58) Field of Classification Search
USPC .................................................... 341/51, 107
See application file for complete search history.

(56) References Cited

U.S. PATENT DOCUMENTS 5,841,377 A 11/1998 Takamizawa et al.
6,496,798 B1 * 12/2002 Huang et al. .................. 704/230

(Continued)

FOREIGN PATENT DOCUMENTS

JP 10 20897 1/1998
JP 2007 104549 4/2007

(Continued)

OTHER PUBLICATIONS

Hans, Mat et al., "Lossless Compression of Digital Audio", IEEE Signal Processing Magazine, vol. 18, No. 4, ISSN: 1053-5888, pp. 21-32, (Jul. 2001).

(Continued)

*Primary Examiner* — Khai M Nguyen
(74) *Attorney, Agent, or Firm* — Oblon, Spivak, McClelland, Maier & Neustadt, L.L.P.

(57) ABSTRACT

An object of the present invention is to achieve high coding efficiency for a companded signal sequence and reduce the amount of codes. A coding method according to the present invention includes an analysis step and a signal sequence transformation step. The analysis step is to check whether or not there is a number that is included in a particular range but does not occur in a second signal sequence (a number sequence that indicates the magnitude (magnitude relationship) of original signals) and output information that indicates the number that does not occur. The signal sequence transformation step is to output a transformed second signal sequence (which is formed by assigning new numbers to indicate the magnitudes of original signals (the magnitude relationship among original signals) excluding the magnitude of the original signal indicated by the number that does not occur and replacing the numbers in the second signal sequence with the newly assigned numbers) in the case where it is determined in the analysis step that there is a number that does not occur. The particular range is defined as a number that indicates a positive value having a minimum absolute value and a number that indicates a negative value having a minimum absolute value, for example.

17 Claims, 21 Drawing Sheets

(56) References Cited

U.S. PATENT DOCUMENTS

| | | | |
|---|---|---|---|
| 6,741,651 B1 | 5/2004 | Watabe et al. | |
| 7,230,551 B2 * | 6/2007 | Moriya et al. | 341/83 |
| 7,298,303 B2 | 11/2007 | Kobayashi et al. | |

FOREIGN PATENT DOCUMENTS

| | | |
|---|---|---|
| JP | 2007 286146 | 11/2007 |
| JP | 2009-139503 | 6/2009 |
| JP | 2009-139504 | 6/2009 |
| JP | 2009-139505 | 6/2009 |
| JP | 4598877 B2 | 10/2010 |
| WO | 99 38262 | 7/1999 |

OTHER PUBLICATIONS

"Pule Code Modulation (PCM) of Voice Frequencies", ITU-T Recommendation G.711, 10 Pages, (Nov. 1988).
Office Action issued Apr. 19, 2011, in Japanese Patent Application No. 2009-545447 (with English translation).

* cited by examiner

FIG.19

TABLES (2a, 2b) FOR μ-LAW IN NON-PATENT LITERATURE 2

| 8-BIT FORM IN μ-LAW | QUANTIZED VALUE OF ORIGINAL SIGNAL | NUMBER INDICATING MAGNITUDE OF ORIGINAL SIGNAL | BOTH POSITIVE AND NEGATIVE MINIMUM AMPLITUDE VALUES EXIST WITHIN X | | BOTH POSITIVE AND NEGATIVE MINIMUM AMPLITUDE VALUES DO NOT EXIST WITHIN X | | NEGATIVE MINIMUM AMPLITUDE VALUE DOES NOT EXIST IN X | | POSITIVE MINIMUM AMPLITUDE VALUE DOES NOT EXIST IN X | |
|---|---|---|---|---|---|---|---|---|---|---|
| | | | T(X) | T(Y) | T(X) | T(Y) | T(X) | T(Y) | T(X) | T(Y) |
| 0x80 | +8031 | +127 | +127 | +127 | +126 | +126 | +127 | +127 | +127 | +127 |
| 0x81 | +7775 | +126 | +126 | +126 | +125 | +125 | +126 | +126 | +126 | +126 |
| ⋮ | ⋮ | ⋮ | ⋮ | ⋮ | ⋮ | ⋮ | ⋮ | ⋮ | ⋮ | ⋮ |
| 0xFE | +2 | +1 | +1 | +1 | 0 | 0 | +1 | +1 | +1 | +1 |
| 0xFF | 0 | +0 | 0 | 0 | No | 0 | 0 | 0 | No | 0 |
| 0x7F | 0 | -0 | -1 | No | No | No | No | No | 0 | No |
| 0x7E | -2 | -1 | -2 | -2 | -1 | -1 | -1 | -1 | -1 | -1 |
| ⋮ | ⋮ | ⋮ | ⋮ | ⋮ | ⋮ | ⋮ | ⋮ | ⋮ | ⋮ | ⋮ |
| 0x01 | -7775 | -126 | -127 | -127 | -126 | -126 | -126 | -126 | -126 | -126 |
| 0x00 | -8031 | -127 | -128 | -128 | -127 | -127 | -127 | -127 | -127 | -127 |

VALUE THAT SIGNAL IN SECOND SIGNAL SEQUENCE X CAN ASSUME

VALUE THAT SIGNAL IN TRANSFORMED SIGNAL SEQUENCE F'(x) CAN ASSUME

FIG.20

TABLES (1a, 1b) FOR A-LAW IN NON-PATENT LITERATURE 2

| 8-BIT FORM IN A-LAW | VALUE OF EXCLUSIVE OR OF 8-BIT FORM IN A-LAW AND 0 x 55 | QUANTIZED VALUE OF ORIGINAL SIGNAL | NUMBER INDICATING MAGNITUDE OF ORIGINAL SIGNAL | BOTH POSITIVE AND NEGATIVE MINIMUM AMPLITUDE VALUES EXIST WITHIN X | | BOTH POSITIVE AND NEGATIVE MINIMUM AMPLITUDE VALUES DO NOT EXIST WITHIN X | | NEGATIVE MINIMUM AMPLITUDE VALUE DOES NOT EXIST IN X | | POSITIVE MINIMUM AMPLITUDE VALUE DOES NOT EXIST IN X | |
|---|---|---|---|---|---|---|---|---|---|---|---|
| | | | | T(X) | T(Y) | T(X) | T(Y) | T(X) | T(Y) | T(X) | T(Y) |
| 0xFF | 0xAA | +4032 | +128 | +127 | +127 | +126 | +126 | +127 | +127 | +127 | +127 |
| 0xFE | 0xAB | +3904 | +127 | +126 | +126 | +125 | +125 | +126 | +126 | +126 | +126 |
| ⋮ | ⋮ | ⋮ | ⋮ | ⋮ | ⋮ | ⋮ | ⋮ | ⋮ | ⋮ | ⋮ | ⋮ |
| 0x81 | 0xD4 | +3 | +2 | +1 | +1 | 0 | 0 | +1 | +1 | +1 | +1 |
| 0x80 | 0xD5 | +1 | +1 | 0 | 0 | No | 0 | 0 | 0 | No | 0 |
| 0x00 | 0x55 | -1 | -1 | -1 | -1 | No | -1 | No | 0 | 0 | 0 |
| 0x01 | 0x54 | -3 | -2 | -2 | -2 | -1 | -1 | -1 | -1 | -1 | -1 |
| ⋮ | ⋮ | ⋮ | ⋮ | ⋮ | ⋮ | ⋮ | ⋮ | ⋮ | ⋮ | ⋮ | ⋮ |
| 0x7E | 0x2B | -3904 | -127 | -127 | -127 | -126 | -126 | -126 | -126 | -126 | -126 |
| 0x7F | 0x2A | -4032 | -128 | -128 | -128 | -127 | -127 | -127 | -127 | -127 | -127 |

VALUE THAT SIGNAL IN SECOND SIGNAL SEQUENCE X CAN ASSUME

VALUE THAT SIGNAL IN TRANSFORMED SIGNAL SEQUENCE F'(x) CAN ASSUME

CODING METHOD, DECODING METHOD, AND APPARATUSES, PROGRAMS AND RECORDING MEDIA THEREFOR

CROSS-REFERENCE TO RELATED APPLICATIONS

This is a divisional application of U.S. application Ser. No. 12/746,275, filed Jun. 28, 2010, the entire contents of which are incorporated herein by reference, which is a National Stage of PCT/JP08/072,513 filed Dec. 11, 2008, and claims the benefit of priority under 35 U.S.C. §119 of Japanese Application No. 2007-319805 filed Dec. 11, 2007.

TECHNICAL FIELD

The present invention relates to a coding method for a signal sequence, a decoding method for a signal sequence, and apparatuses, programs and recording media therefor.

BACKGROUND ART

A known reversible, lossless coding is a method of compressing information, such as a sound and an image. Besides, various types of compression coding methods have been proposed to deal with cases where a waveform is directly recorded in the form of a linear PCM signal (see Non-patent literature 1).

On the other hand, in audio transmission for long-distance telephone or VoIP, the logarithm approximation companding PCM (see Non-patent literature 2), in which the amplitude is expressed in logarithm approximation, is used instead of the linear PCM, in which the amplitude is expressed by a numerical value.

Non-patent literature 1: Mat Hans, "Lossless Compression of Digital Audio," IEEE SIGNAL PROCESSING MAGAZINE, July 2001, pp. 21-32

Non-patent literature 2: ITU-T Recommendation G.711, "Pulse Code Modulation (PCM) of Voice Frequencies"

DISCLOSURE OF THE INVENTION

Problem to be Solved by the Invention

As the VoIP system becomes popular as an alternative to the conventional telephone system, the capacity required for VoIP audio transmission increases. For example, in the case of ITU-T G.711 disclosed in Non-patent literature 2, a transmission capacity of 64 kbit/s multiplied by 2 is required per line. However, the required transmission capacity increases with the number of lines. Thus, a compression coding method for a companded signal sequence (a technique of reducing the amount of codes), such as a logarithm approximation companding PCM, is needed. Companding means to indicate the magnitude of an original signal sequence (a magnitude relationship among signals in an original signal sequence, for example) by a number sequence. A number sequence indicating a magnitude relationship among signals in an original signal sequence means a sequence of numbers assigned at regular intervals in such a manner that the magnitude relationship is maintained or inverted. Of the numbers that indicate the magnitude relationship among the original signals, two different numbers may be assigned to one amplitude ("0", for example). In this case, the two numbers indicate the same amplitude. FIG. 1 is a diagram showing an exemplary amplitude of a second signal sequence. The horizontal axis indicates values for the linear PCM, and the vertical axis indicates corresponding values for the logarithm approximation companding PCM. FIG. 2 is a diagram showing a specific form of an 8-bit μ-law. The 8 bits include one bit indicating a sign (positive or negative) (polarity), three bits indicating an exponent (exponent part), and four bits indicating an increment of a linear code (slope) (linear part). This form of logarithm approximation companding PCM can express numerical values from −127 to 127. These values correspond to numerical values from −8158 to 8158 in the linear PCM (see FIG. 1).

A coding apparatus and a decoding apparatus described below can be contemplated as a compression coding technique for a companded signal sequence (referred to as a second signal sequence hereinafter), such as the logarithm approximation companding PCM. FIG. 3 shows an exemplary functional configuration of the coding apparatus that codes a second signal sequence. FIG. 4 shows an exemplary flow of a process performed by the coding apparatus. A coding apparatus 800 comprises a linear prediction part 810, a quantization part 820, a predicted value calculation part 830, a subtraction part 840, a coefficients coding part 850, and a residual coding part 860. In the case where an input signal sequence to the coding apparatus 800 is not previously divided into frames, the coding apparatus 800 further comprises a frame division part 870. The frame division part 870 divides the input signal sequence into frames and outputs the resulting second signal sequence X={x(1), x(2), . . . , x(N)}. In this expression, N represents the number of samples in one frame.

When the second signal sequence X divided into frames is input to the coding apparatus 800, the linear prediction part 810 determines linear prediction coefficients K={k(1), k(2), . . . , k(P)} from the second signal sequence X divided into frames (S810). In this expression, P represents a prediction order. The quantization part 820 quantizes the linear prediction coefficients K to determine quantized linear prediction coefficients K'={k'(1), k'(2), . . . , k'(P)} (S820). The predicted value calculation part 830 uses the second signal sequence X and the quantized linear prediction coefficients K' to determine a second predicted value sequence Y={y(1), y(2), . . . , y(N)} according to the following expression (S830).

$$y(n)=\sum_{i=1}^{P}k'(i)x(n-i) \tag{1}$$

In this expression, n represents an integer equal to or greater than 1 and equal to or smaller than N. The subtraction part 840 determines the difference between the second signal sequence X and the second predicted value sequence Y, that is, the prediction residual sequence E={e(1), e(2), . . . , e(N)} (S840). The coefficients coding part 850 codes the quantized linear prediction coefficients K' and outputs a prediction coefficients code $C_k$ (S850). The residual coding part 860 codes the prediction residual sequence E and outputs a prediction residual code $C_e$ (S860).

FIG. 5 shows an exemplary functional configuration of the decoding apparatus that performs decoding into the second signal sequence. FIG. 6 shows an exemplary flow of a process performed by the decoding apparatus. A decoding apparatus 900 comprises a residual decoding part 910, a coefficients decoding part 920, a predicted value calculation part 930 and an addition part 940. The residual decoding part 910 decodes the prediction residual code $C_e$ to determine the prediction residual sequence E (S910). The coefficients decoding part 920 decodes the prediction coefficients code $C_k$ to determine the quantized linear prediction coefficients K' (S920). The predicted value calculation part 930 uses the decoded second signal sequence X and the quantized linear prediction coefficients K' to determine the second predicted value sequence Y according to the following expression (S930).

$$y(n) = \sum_{i=1}^{P} k'(i)x(n-i) \tag{2}$$

The addition part 940 sums the second predicted value sequence Y and the prediction residual sequence E to determine the second signal sequence X (S940). In this way, the companded signal sequence can be reversibly compressed. However, the reversible compression of the companded signal sequence, such as that according to G 711, described above is not sufficiently efficient.

The present invention has been devised in view of such circumstances, and an object of the present invention is to achieve high coding efficiency for a companded signal sequence and reduce the amount of codes.

Means to Solve Problems

A coding method according to the present invention is a coding method that codes a number sequence (referred to as a second signal sequence hereinafter). The coding method according to the present invention comprises an analysis step and a signal sequence transformation step. The analysis step is to check whether or not there is a number that is included in a particular range but does not occur in the second signal sequence and output information that indicates the number that does not occur. The signal sequence transformation step is to output a number sequence (referred to as a transformed second signal sequence hereinafter) formed by assigning new numbers to indicate the magnitudes of original signals excluding the magnitude of the original signal indicated by the number that does not occur and replacing the numbers in the second signal sequence with the newly assigned numbers, in the case where it is determined in the analysis step that there is a number that does not occur. The particular range is defined as a number that indicates a positive value having a minimum absolute value and a number that indicates a negative value having a minimum absolute value, for example. More specifically, the numbers are "+0" and "−0" for the μ-law according to the ITU-T G.711 described in Non-patent literature 2 and are "+1" and "−1" for the A-law.

A decoding method according to the present invention is a decoding method that decodes information coded by taking advantage of the fact that the occurrence frequency of a number in a particular range is high into a second signal sequence. The decoding method according to the present invention comprises a signal sequence inverse transformation step of transforming a transformed second signal sequence into the second signal sequence using information that indicates a number that is included in a particular range but does not occur in the case where there is the number that does not occur. For the A-law, the numbers expressed as a 13-bit signed integer are "+1" and "−1", and the corresponding numbers expressed as a 16-bit signed integer are "+8" and "−8". Depending on the actual situation to which the present invention is applied, the numbers "+1" and "−1" are appropriately interchanged with the numbers "+8" and "−8".

Effects of the Invention

In entropy coding or the like, a number that is supposed to have a high occurrence frequency has a short code length. However, if there is a number that does not occur in the high occurrence frequency range (a particular range), the coding efficiency decreases. In the coding method and decoding method according to the present invention, coding and decoding are performed using a transformed second signal sequence (which is formed by assigning new numbers to indicate the magnitudes of original signals excluding the magnitude of the original signal indicated by the number that does not occur and replacing the numbers in the second signal sequence with the newly assigned numbers). That is, there is not any number that does not occur in the high occurrence frequency range. As a result, the coding efficiency is improved.

Lossless coding of a prediction residual sequence is an example of the application of the entropy coding. However, the present invention is not limited thereto.

The present invention is particularly advantageous in the case where one number "0" is expressed in two ways, "+0" and "−0", such as in the μ-law according to ITU-T G.711 described in Non-patent literature 2. This is because some coding apparatuses use only one of "+0" and "−0" to represent a number "0".

BRIEF DESCRIPTION OF THE DRAWINGS

FIG. 19 is a table showing a specific example of transformation and conversion according to the μ-law;

FIG. 20 is a table showing a specific example of transformation and conversion according to the μ-law.

DESCRIPTION OF REFERENCE NUMERALS

Figure 1:
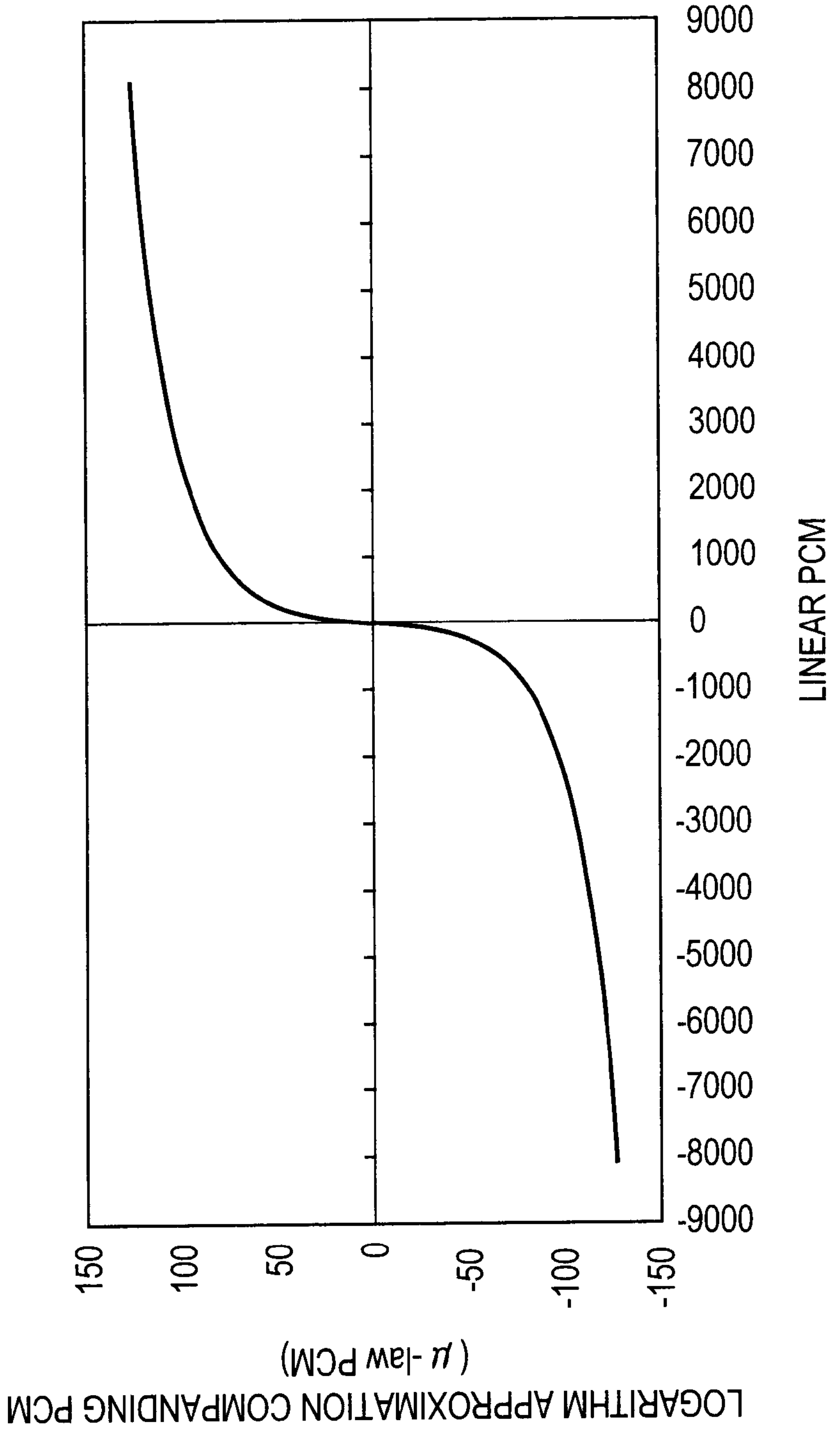
FIG. 1 is a diagram showing an exemplary amplitude of a companded signal sequence.

100, 300, 500, 800: coding apparatus
110, 510, 810: linear prediction part
130, 530, 830: predicted value calculation part
140, 840: subtraction part
160, 860: residual coding part
170: signal sequence transformation part
180: analysis part
200, 400, 600, 900: decoding apparatus
230, 630, 930: predicted value calculation part
240, 940: addition part
250: signal sequence inverse transformation part
330, 430, 535, 635: predicted value sequence transformation part
515, 615: transformation part
820: quantization part
850: coefficients coding part
870: frame division part
910: residual decoding part
920: coefficients decoding part

BEST MODES FOR CARRYING OUT THE INVENTION

In the following, components having the same functions or process steps of the same processings are denoted by the same reference numerals, and redundant descriptions thereof will be omitted.

[First Embodiment]

Figure 7:
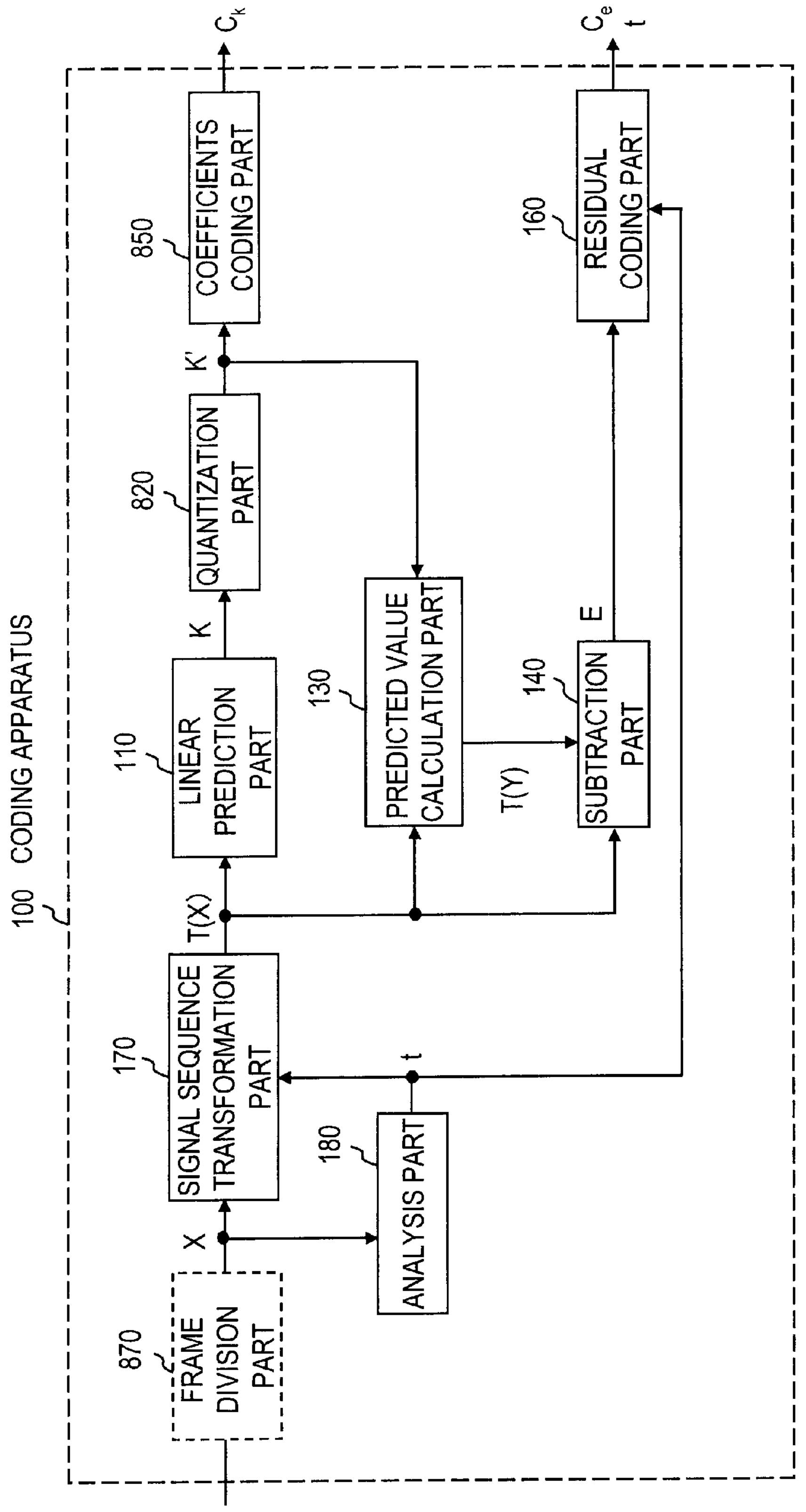
FIG. 7 is a diagram showing an exemplary functional configuration of a coding apparatus according to a first embodiment.
Figure 8:
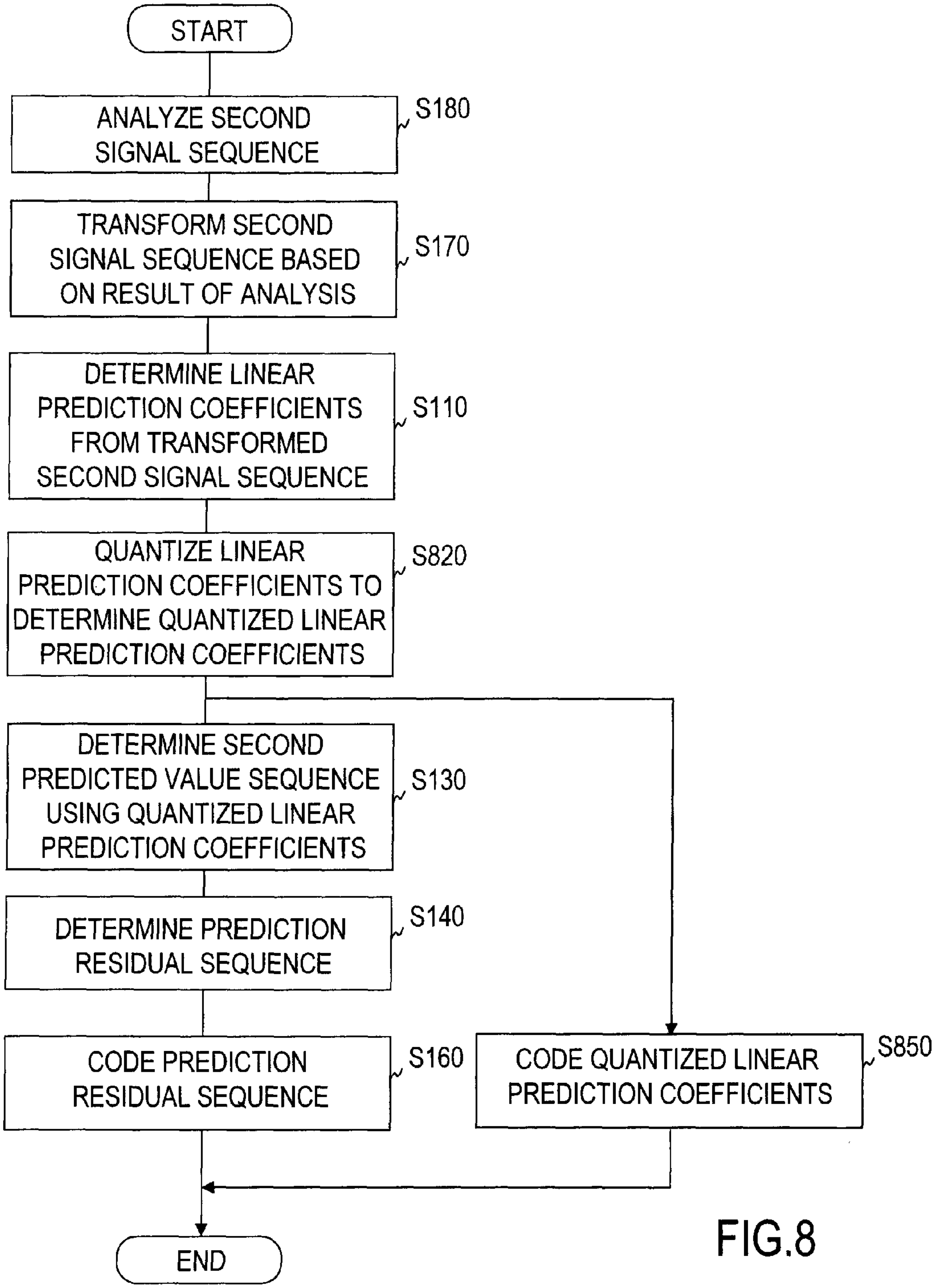
FIG. 8 shows an exemplary flow of a process performed by the coding apparatus according to the first embodiment.

FIG. 7 shows an exemplary functional configuration of a coding apparatus according to a first embodiment, and FIG. 8 shows an exemplary flow of a process performed by the coding apparatus according to the first embodiment. A coding apparatus 100 codes a number sequence (referred to as a second signal sequence hereinafter) (into a prediction residual code $C_e$, for example). The coding apparatus 100 comprises at least an analysis part 180, a signal sequence transformation part 170, a linear prediction part 110, a quantization part 820, a predicted value calculation part 130, a subtraction part 140, a coefficients coding part 850, and a residual coding part 160. The analysis part 180 checks whether or not there is a number that is included in a particular range but does not occur in a second signal sequence X={x(1), x(2), . . . , x(N)} and outputs information t that indicates the number that does not occur (S180). In the expression above, N represents the number of samples in one frame. The "particular range" is defined as a number that indicates a positive value having a minimum absolute value and a number that indicates a negative value having a minimum absolute value, for example. More specifically, the values are "+0" and "−0" for the μ-law according to the ITU-T G.711 described in Non-patent literature 2 and are "+1" and "−1" for the A-law. For the A-law, the numbers "+1" and "−1" are those expressed as a 13-bit signed integer, and the corresponding numbers expressed as a 16-bit signed integer are "+8" and "−8". Depending on the actual situation to which the present invention is applied, the numbers "+1" and "−1" are appropriately interchanged with the numbers "+8" and "−8".

If it is determined in step S180 (analysis step) that there is a number that does not occur, the signal sequence transformation part 170 assigns new numbers to indicate the magnitudes of original signals excluding the magnitude of an original signal indicated by the number that does not occur, replaces the numbers in the second signal sequence with the newly assigned numbers, and outputs the resulting number sequence T(X)={T(x(1)), T(x(2)), . . . , T(x(N))} (referred to as a transformed second signal sequence hereinafter) (S170).

Figure 2:
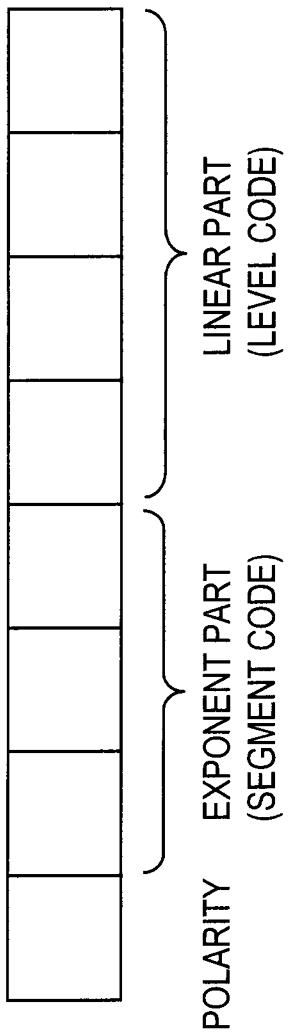
FIG. 2 is a diagram showing a specific form of an 8-bit μ-law.
Figure 3:
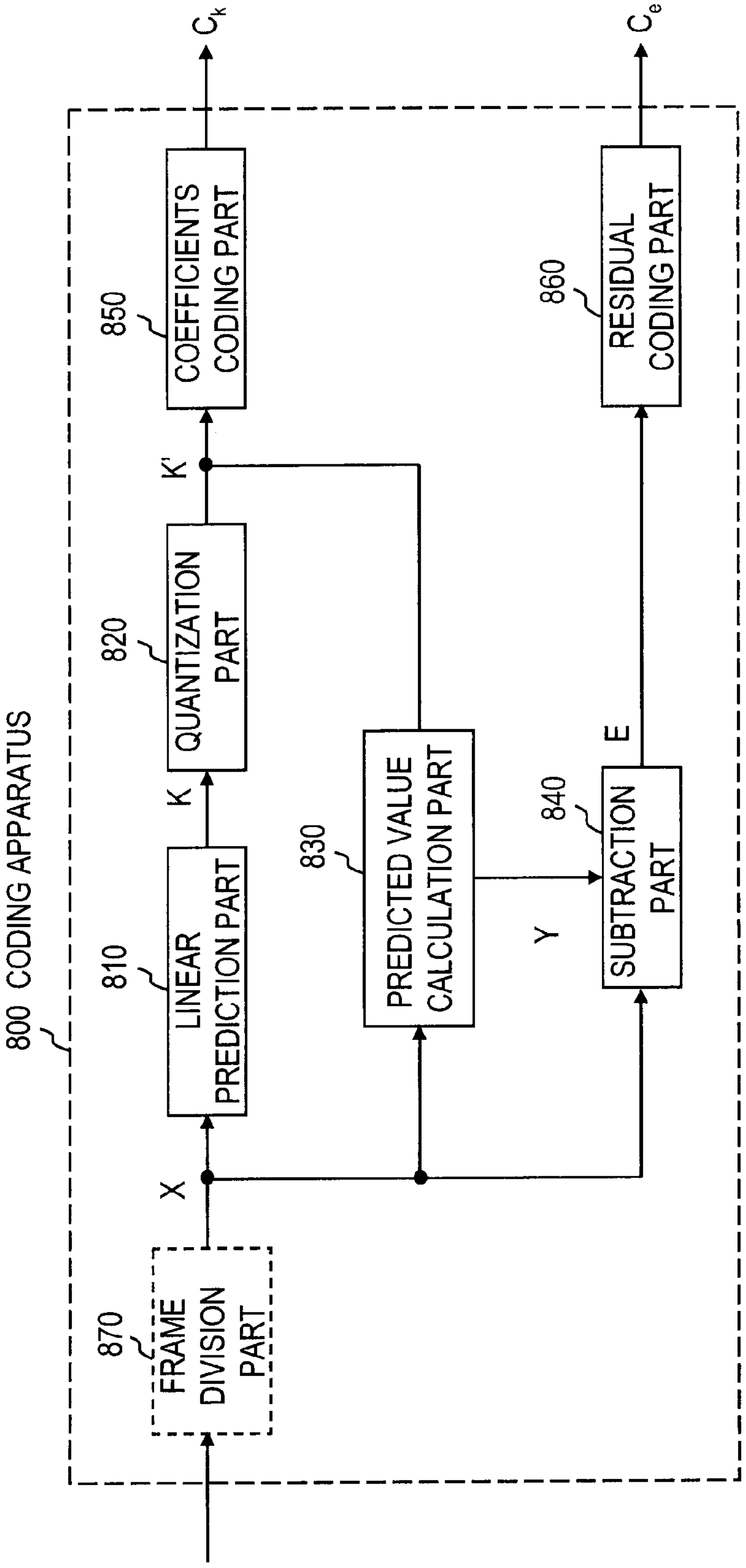
FIG. 3 is a diagram showing an exemplary functional configuration of a coding apparatus.
Figure 4:
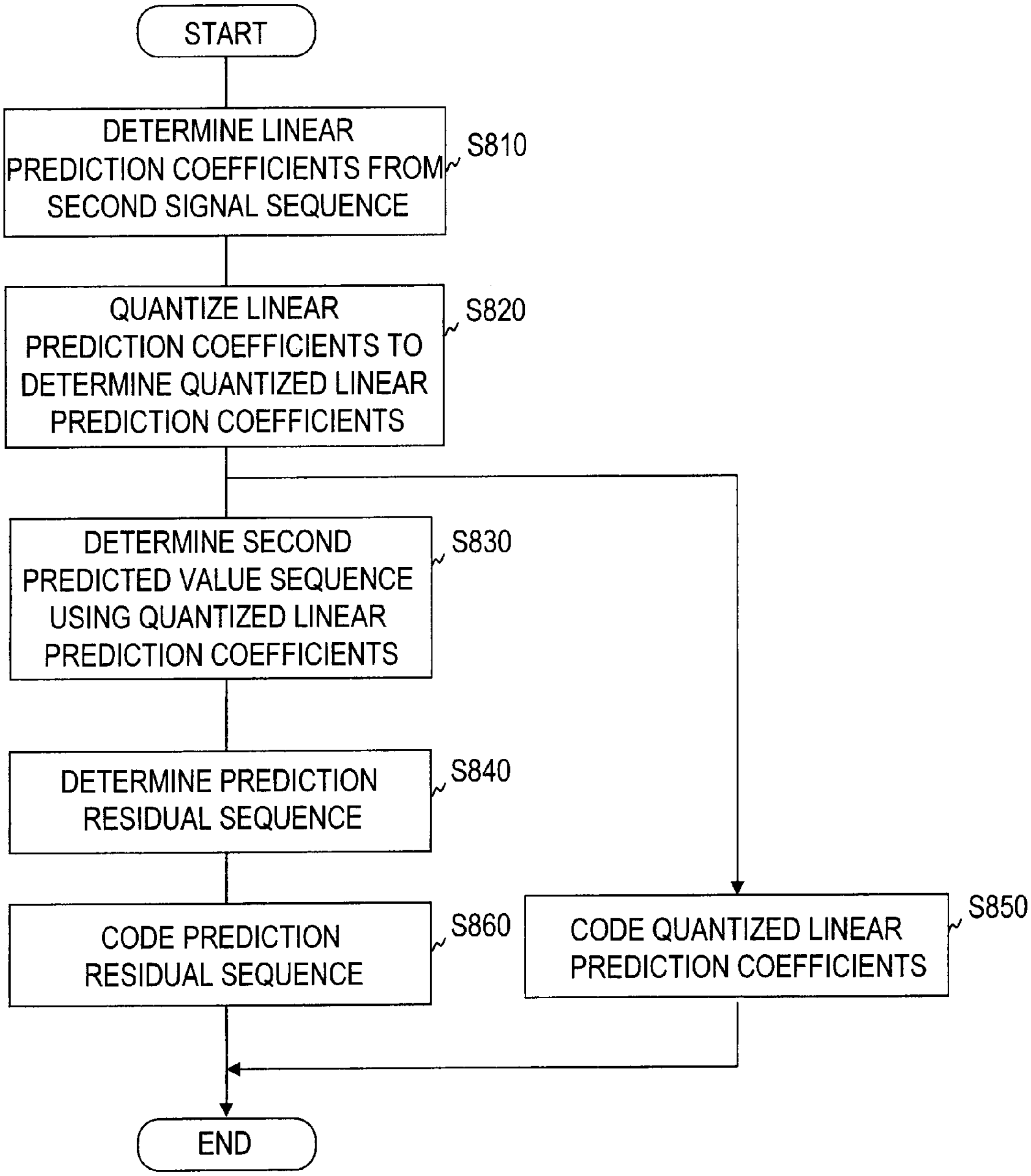
FIG. 4 shows an exemplary flow of a process performed by the coding apparatus.
Figure 5:
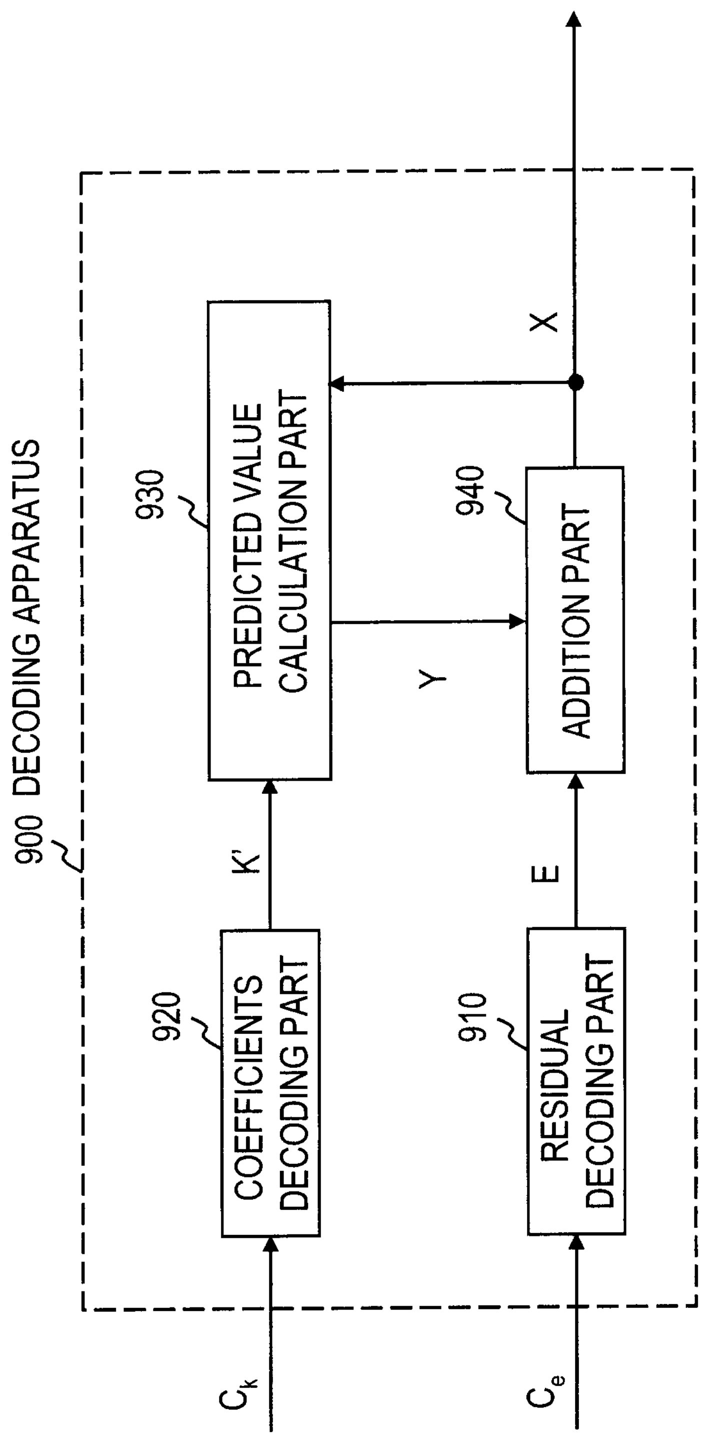
FIG. 5 is a diagram showing an exemplary functional configuration of a decoding apparatus.
Figure 6:
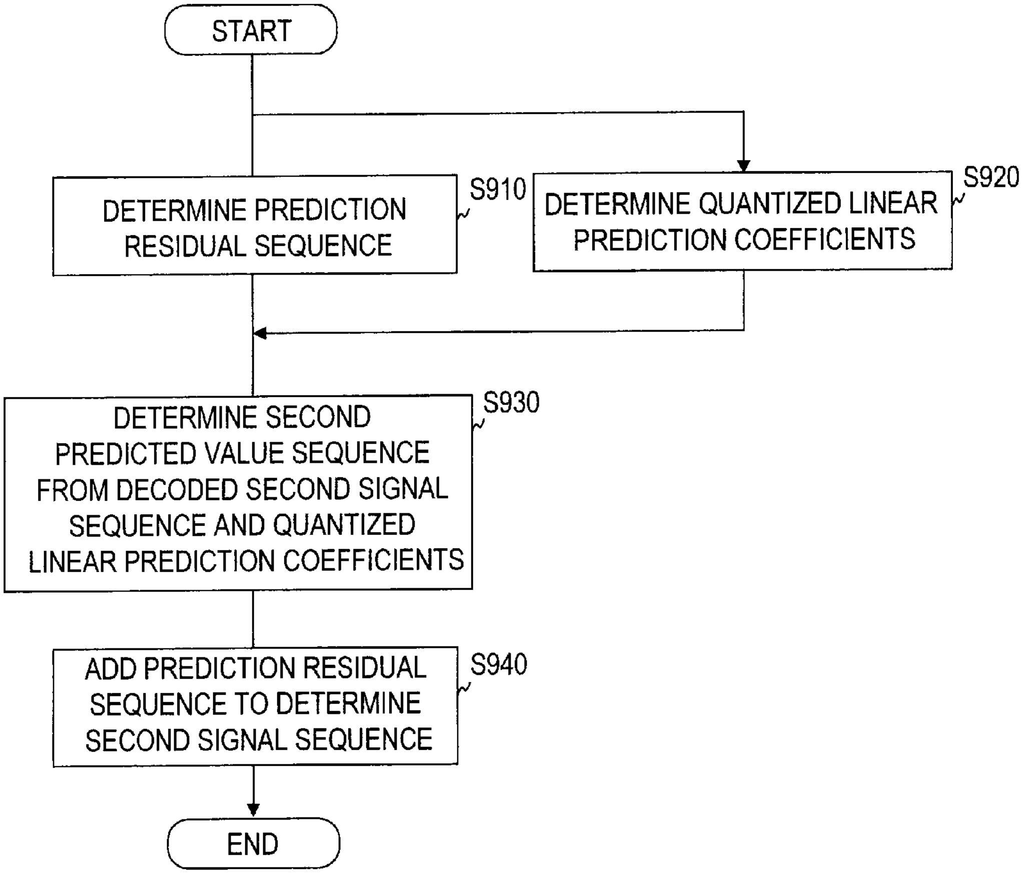
FIG. 6 shows an exemplary flow of a process performed by the decoding apparatus.

As an example, consider the case of the μ-law according to the ITU-T G.711 described in Non-patent literature 2. As described above with reference to FIG. 2, according to the μ-law, numbers from "−127" to "+127" are expressed by 8 bits. However, the number "0" is expressed in two ways, "+0" and "−0". In the relationship between the numbers and values in linear relationship with the original signals, the number "−127" represents a value <−8031>, the number "+127" represents a value <+8031>, and the numbers "+0" and "−0" represent a value <0>. Note that a numeric enclosed in quotation marks (" ") represents a number that indicates the magnitude of an original signal (the magnitude relationship between original signals), and a numeric enclosed in angle brackets (< >) represents the amplitude of a signal in a linear relationship with an original signal. Since the numbers "+0" and "−0" are redundant, some coding apparatuses output only one of the numbers. For example, it is supposed that the particular range is defined as "+0" and "−0". Then, if the number "−0" does not occur, the negative numbers are shifted by one, so that the number "−0" represents a value <−1>, and the number "−126" represents a value <−8031>. If the number "+0" does not occur, the positive numbers are shifted by one, so that the number "+0" represents a value <+1>. If both the numbers "+0" and "−0" do not occur, both the negative numbers and the positive numbers are shifted by one, so that the number "−0" represents a value <−1>, and the number "+0" represents a value <+1>.

The linear prediction part 110 performs a linear prediction analysis of the transformed second signal sequence T(X) to determine linear prediction coefficients K={k(1), k(2), . . . , k(P)} (S110). In this expression, P represents a prediction order. The quantization part 820 quantizes the linear prediction coefficients K to determine quantized linear prediction coefficients K'={k'(1), k'(2), . . . , k'(P)} (S820). As an alternative to the processings in steps S110 and S820, the coding apparatus 100 may perform an equivalent processing using a table containing candidates k'(m, p) for the quantized linear prediction coefficients (where 1≤m≤M, and M is an integer equal to or greater than 2). In this case, the coding apparatus 100 can have a quantization/linear prediction part instead of the linear prediction part 110 and the quantization part 820. Then, the quantization/linear prediction part determines a predicted value sequence for the set of candidates k'(m, p) according to the formula (3) described below (which is the formula (I) with X replaced with T(X)). Then, the quantized linear prediction coefficients K' for the transformed second signal sequence T(X) can be determined by adopting, as the quantized linear prediction coefficients K', the set of candidates k'(m, p) for which the sum or absolute sum of the differences in power between the samples in the predicted value sequence and the corresponding samples in the transformed second signal sequence T(X) is at minimum. The predicted value calculation part 130 uses a previous transformed second signal sequence T(X) and the quantized linear prediction coefficients K' to determine a transformed second predicted value sequence T(Y)={T(y(1)), T(y(2)), . . . , T(y (N))}, which is a result of prediction of the transformed second signal sequence, according to the following formula (S130).

$$T(y(n)) = \sum_{i=1}^{P} k'(i)T(x(n-i)) \tag{3}$$

In this formula, n represents an integer equal to or greater than 1 and equal to or smaller than N. The subtraction part 140 determines the difference between the transformed second predicted value sequence T(Y) and the transformed second signal sequence T(X), that is, a prediction residual sequence E={e(1), e(2), . . . , e(N)} (8140). In the case where the coding apparatus has the quantization/linear prediction part instead of the linear prediction part 110 and the quantization part 820, the predicted value calculation part 130 and the subtraction part 140 may be integrated into the quantization/linear prediction part. In this case, instead of the processings in steps S130 and S140, the prediction residual sequence E can be determined by adopting, as the prediction residual sequence E, the difference between the predicted value sequence corresponding to the quantized linear prediction coefficients K' previously determined by the quantization/linear prediction part and the transformed second signal sequence T(X). The coefficients coding part 850 codes the quantized linear prediction coefficients K' and outputs a prediction coefficients code $C_k$ (S850). The residual coding part 160 codes the prediction residual sequence E and outputs a prediction residual code $C_e$. In addition, the residual coding part 160 outputs information t that indicates a number that does not occur (S160). If the linear prediction is appropriately performed, the values in the prediction residual sequence E tend to be small and thus are likely to be close to 0. Therefore, entropy coding, such as Golom-Rice coding, is used in many cases. Therefore, if there is a number that does not occur in the range for which the occurrence frequency is supposed to be high, the coding efficiency decreases. However, since the coding apparatus 100 performs coding by using the transformed second signal sequence (which is formed by assigning new numbers to indicate the magnitudes of original signals excluding the magnitude of an original signal indicated by the number that does not occur and replacing the numbers in the second signal sequence with the newly assigned numbers), the coding apparatus 100 maintains high coding efficiency.

Figure 9:
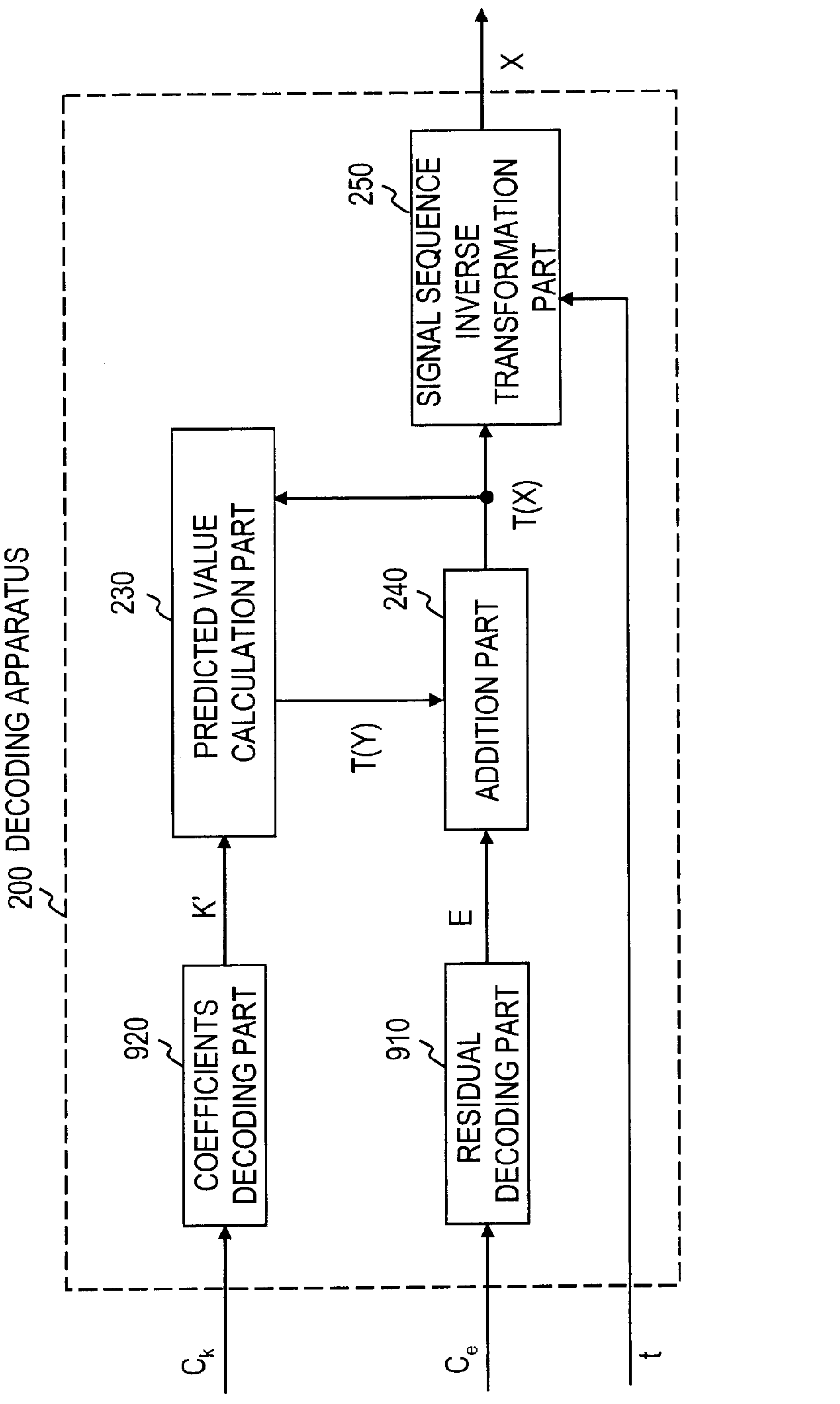
FIG. 9 is a diagram showing an exemplary functional configuration of a decoding apparatus according to the first embodiment.
Figure 10:
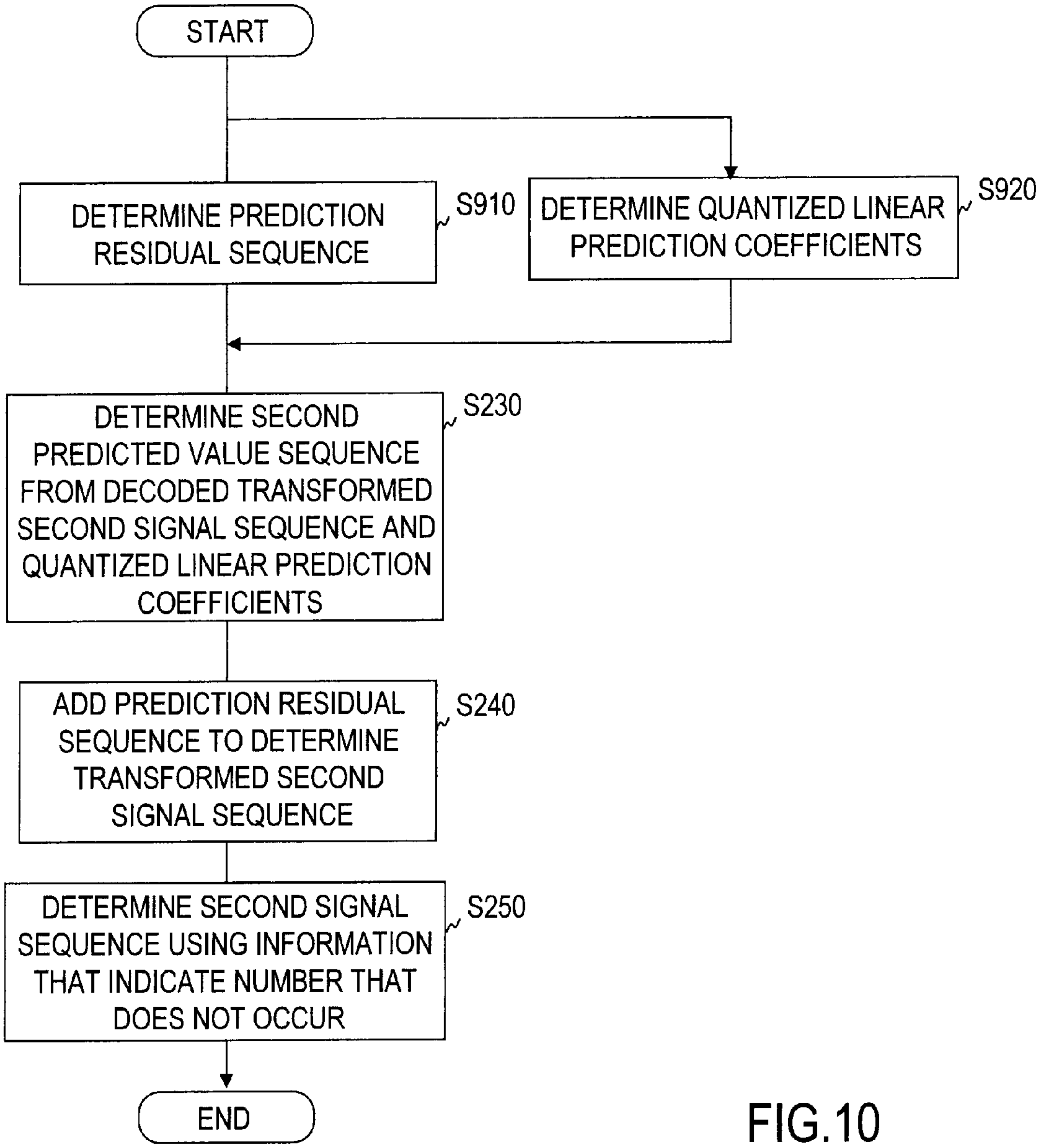
FIG. 10 shows an exemplary flow of a process performed by the decoding apparatus according to the first embodiment.

FIG. 9 shows an exemplary functional configuration of a decoding apparatus according to the first embodiment, and FIG. 10 shows an exemplary flow of a process performed by the decoding apparatus according to the first embodiment. A decoding apparatus 200 receives the prediction coefficients code $C_k$, the prediction residual code $C_e$ and the information t that indicates the number that does not occur. The decoding apparatus 200 decodes the codes (the prediction residual code $C_e$, for example) into a number sequence (referred to as a second signal sequence hereinafter). The decoding apparatus 200 comprises a residual decoding part 910, a coefficients decoding part 920, a predicted value calculation part 230, an addition part 240, and a signal sequence inverse transformation part 250. The residual decoding part 910 determines the prediction residual sequence E={e(1), e(2), . . . , e(N)} from the prediction residual code $C_e$ (S910). The coefficients decoding part 920 determines the quantized linear prediction coefficients K'={k'(1), k'(2), . . . , k'(P)} from the prediction coefficients code $C_k$ (S920). The predicted value calculation part 230 uses the decoded transformed second signal sequence T(X)={T(x(1)), T(x(2)), . . . , T(x(N))} and the quantized linear prediction coefficients K' to determine the transformed second predicted value sequence T(Y)={T(y(1)), T(y(2)), . . . , T(y(N))} according to the following formula (S230).

$$T(y(n)) = \sum_{i=1}^{P} k'(i)T(x(n-i)) \tag{4}$$

The addition part 240 sums the transformed second predicted value sequence T(Y) and the prediction residual sequence E to determine the transformed second signal sequence T(X) (S240). The signal sequence inverse transformation part 250 transforms the transformed second signal sequence T(X) into the second signal sequence X={x(1), x(2), . . . , x(N)} by using the information t that indicates the number that does not occur in the case where there is a number that is included in the particular range but does not occur (S250).

The decoding apparatus 200 configured as described above can decode the information efficiently coded by the coding apparatus 100. Thus, the coding efficiency is improved.

[Second Embodiment]

Figure 11:
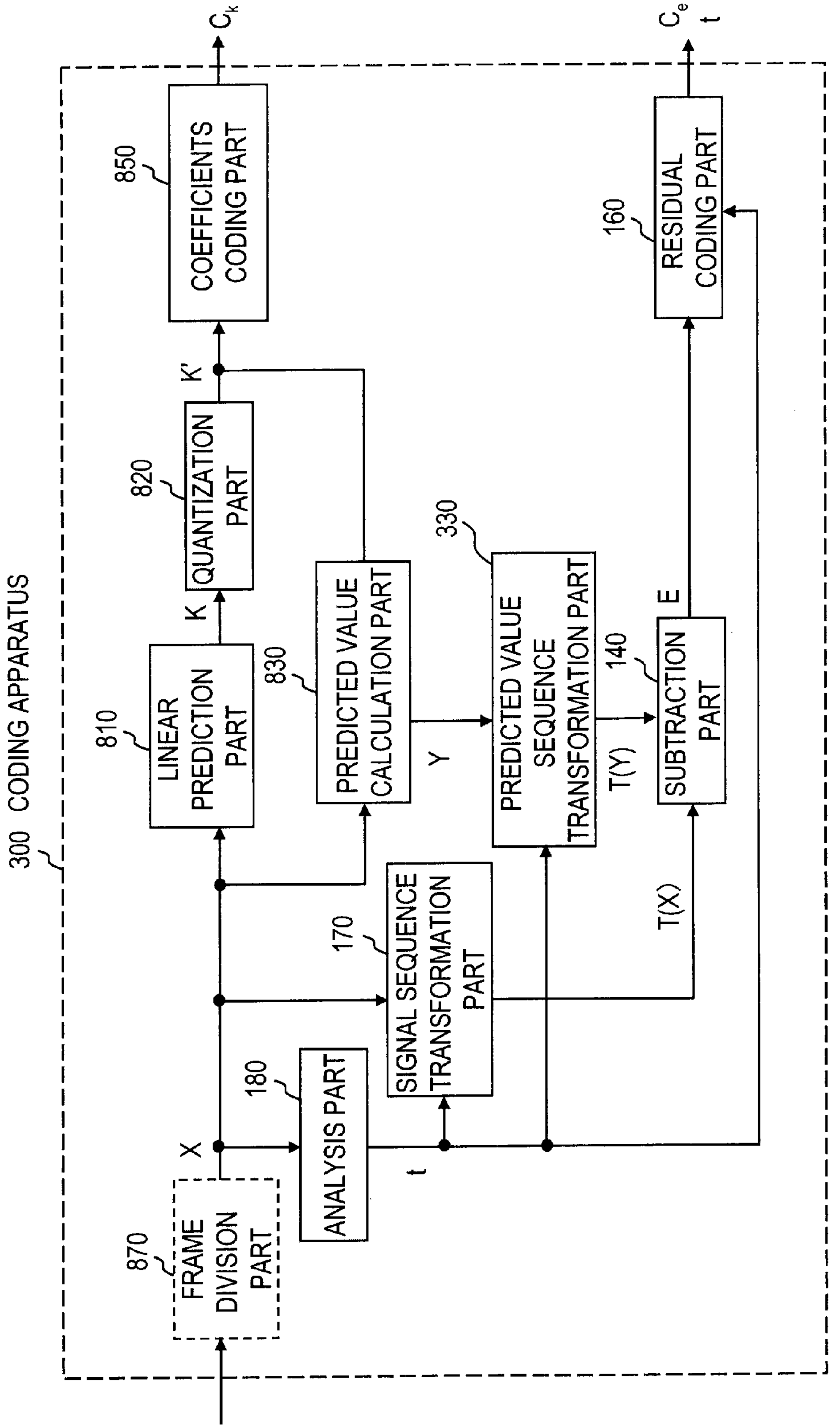
FIG. 11 is a diagram showing an exemplary functional configuration of a coding apparatus according to a second embodiment.
Figure 12:
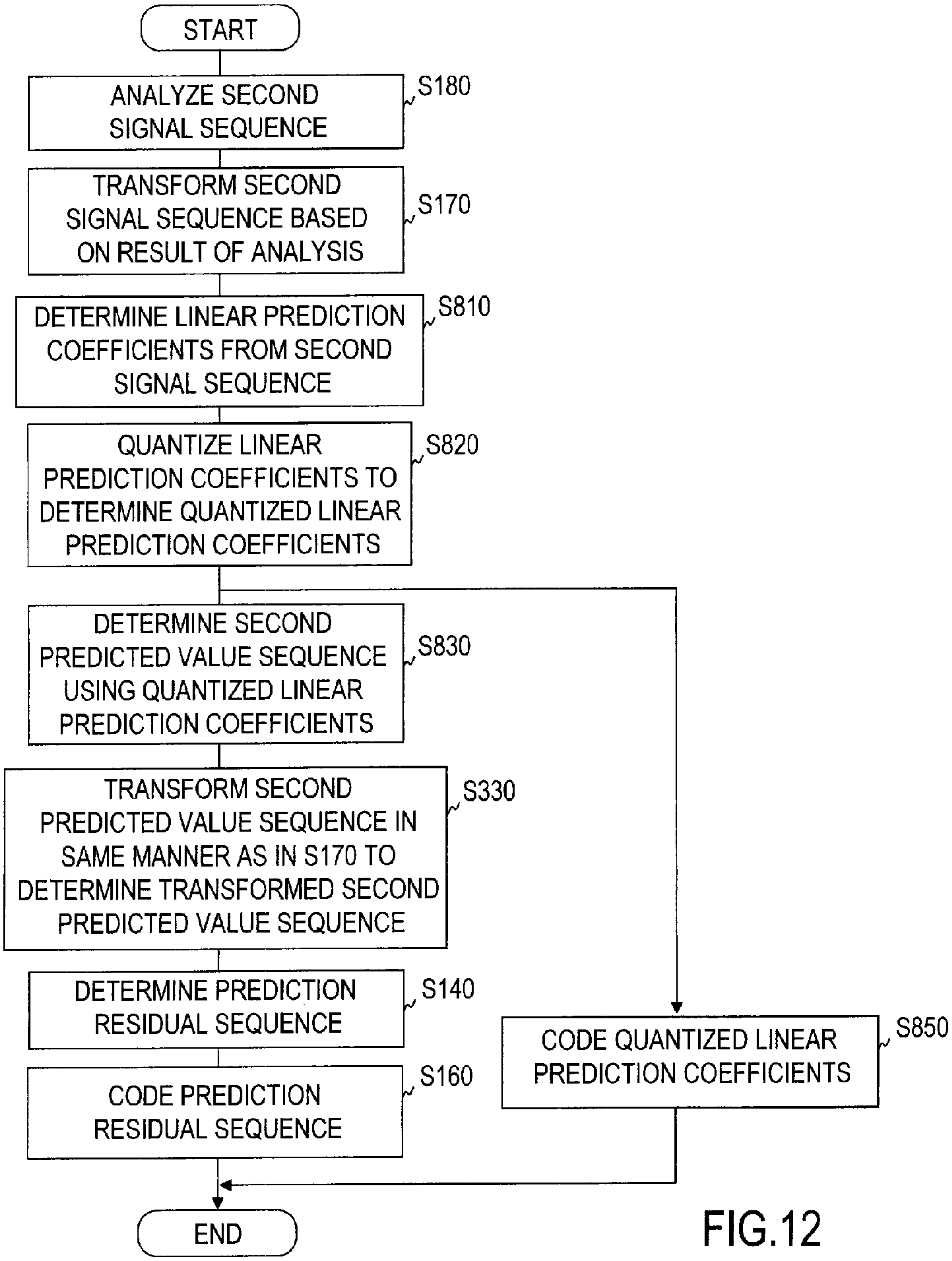
FIG. 12 shows an exemplary flow of a process performed by the coding apparatus according to the second embodiment.

FIG. 11 shows an exemplary functional configuration of a coding apparatus according to a second embodiment, and FIG. 12 shows an exemplary flow of a process performed by the coding apparatus according to the second embodiment. As with the coding apparatus 100, a coding apparatus 300 codes a number sequence (second signal sequence hereinafter). The coding apparatus 300 comprises at least an analysis part 180, a signal sequence transformation part 170, a linear prediction part 810, a quantization part 820, a predicted value calculation part 830, predicted value sequence transformation part 330, a subtraction part 140, a coefficients coding part 850, and a residual coding part 160. The analysis part 180, the signal sequence transformation part 170, the subtraction part 140 and the residual coding part 160 have the same functions as those of the coding apparatus 100.

When a second signal sequence X={x(1), x(2), . . . , x(N)} divided into frames is input to the coding apparatus 300, steps S180 and S170 are performed as with the coding apparatus 100. Then, the linear prediction part 810 determines linear prediction coefficients K={k(1), k(2), . . . , k(P)} from the second signal sequence X divided into frames (S810). In this expression, P represents a prediction order. The quantization part 820 quantizes the linear prediction coefficients K to determine quantized linear prediction coefficients K'={k'(1), k'(2), . . . , k'(P)} (S820). As an alternative to the processings in steps S810 and S820, the coding apparatus 300 may perform an equivalent processing using a table containing candidates k'(m, p) for the quantized linear prediction coefficients (where 1≤m≤M, and M is an integer equal to or greater than 2). In this case, the coding apparatus 300 can have a quantization/linear prediction part instead of the linear prediction part 810 and the quantization part 820. Then, the quantization/linear prediction part determines a predicted value sequence for the set of candidates k'(m, p) according to the formula (1). Then, the quantized linear prediction coefficients K' for the second signal sequence X can be determined by adopting, as the quantized linear prediction coefficients K', the set of candidates k'(m, p) for which the sum or absolute sum of the differences in power between the samples in the predicted value sequence and the corresponding samples in the second signal sequence X is at minimum. The predicted value calculation part 830 uses the second signal sequence X and the quantized linear prediction coefficients K' to determine a second predicted value sequence Y={y(1), y(2), . . . , y(N)} according to the following formula (S830).

$$y(n) = \sum_{i=1}^{P} k'(i)x(n-i) \tag{5}$$

In this formula, n represents an integer equal to or greater than 1 and equal to or smaller than N. In the case where the coding apparatus has the quantization/linear prediction part instead of the linear prediction part 810 and the quantization part 820, the predicted value calculation part 830 may be integrated into the quantization/linear prediction part. In this case, instead of the processing in step S830, the second predicted value sequence Y can be determined by adopting, as the second predicted value sequence Y, a predicted value sequence corresponding to the quantized linear prediction coefficients K' previously determined by the quantization/linear prediction part. The predicted value sequence transformation part 330 transforms the second predicted value sequence Y in the same manner as that of transforming the second signal sequence X into the transformed second signal sequence T(X) in step S170 (signal sequence transformation step) to determine a transformed second predicted value sequence T(Y)={T(y(1)), T(y(2)), . . . , T(y(N))} (S330). The subtraction part 140 determines the difference between the transformed second predicted value sequence T(Y) and the transformed second signal sequence T(X), that is, a prediction residual sequence E (S140). The coefficients coding part 850 codes the quantized linear prediction coefficients K' and outputs a prediction coefficients code $C_k$ (S850). The residual coding part 160 codes the prediction residual sequence E and outputs a prediction residual code $C_e$. In addition, the residual coding part 160 outputs information t that indicates a number that does not occur (S160).

Figure 13:
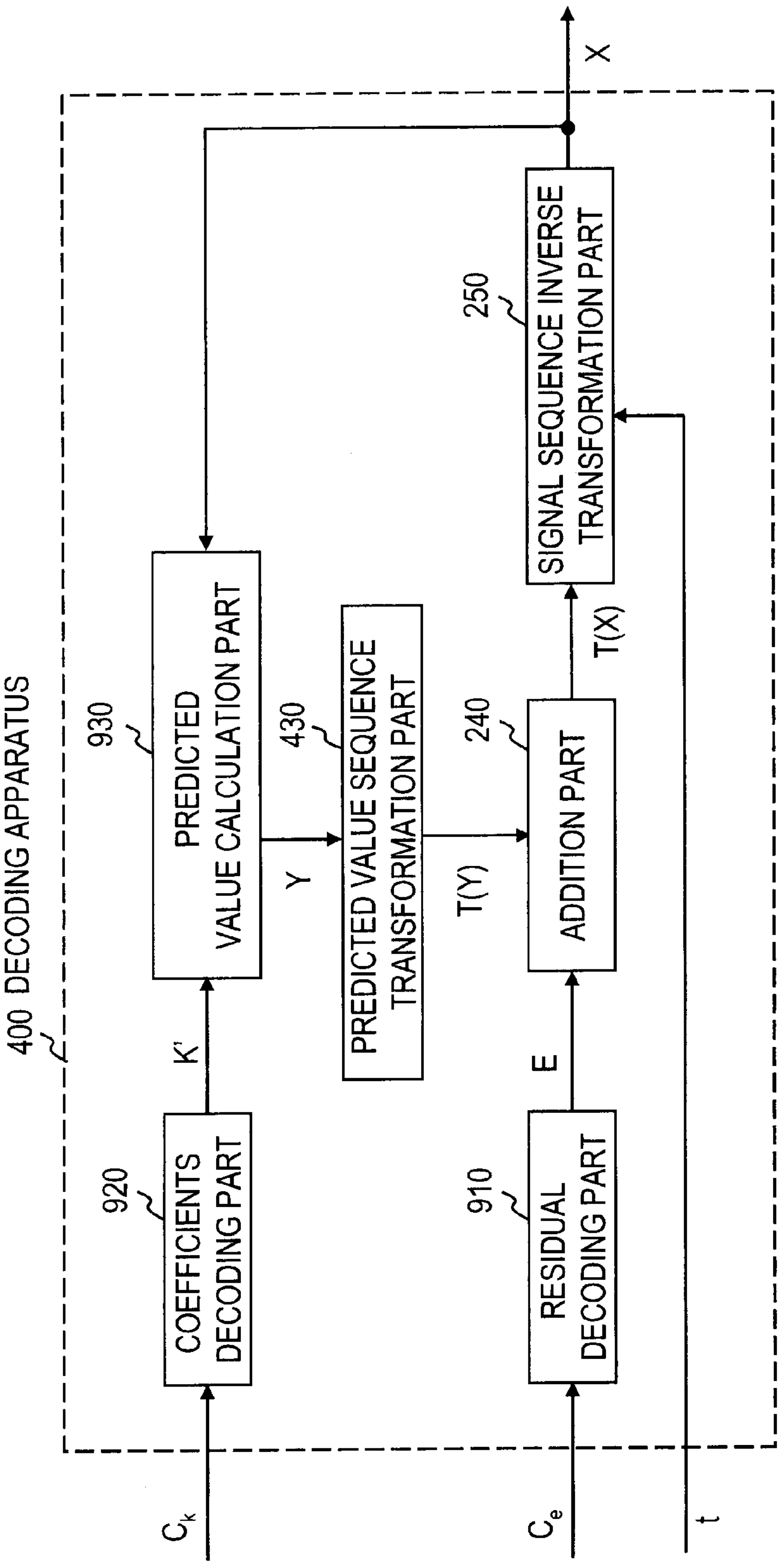
FIG. 13 is a diagram showing an exemplary functional configuration of a decoding apparatus according to the second embodiment.
Figure 14:
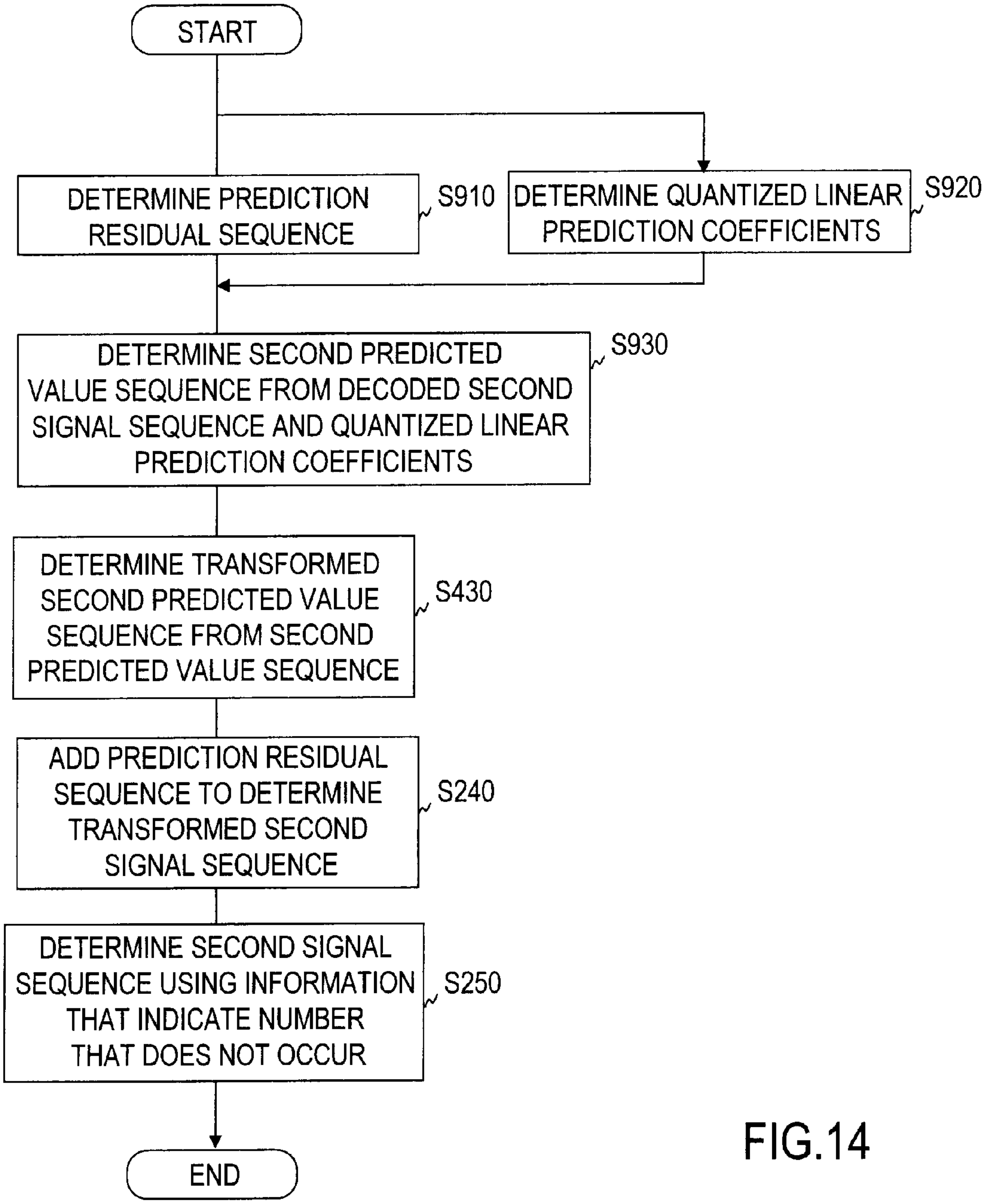
FIG. 14 shows an exemplary flow of a process performed by the decoding apparatus according to the second embodiment.

FIG. 13 shows an exemplary functional configuration of a decoding apparatus according to the second embodiment, and FIG. 14 shows an exemplary flow of a process performed by the decoding apparatus according to the second embodiment. A decoding apparatus 400 receives the prediction coefficients code $C_k$, the prediction residual code $C_e$ and the information t that indicates the number that does not occur. The decoding apparatus 400 decodes the codes into a number sequence (second signal sequence). The decoding apparatus 400 comprises a residual decoding part 910, a coefficients decoding part 920, a predicted value calculation part 930, a predicted value sequence transformation part 430, an addition part 240, and a signal sequence inverse transformation part 250. The addition part 240 and the signal sequence inverse transformation part 250 have the same functions as those of the decoding apparatus 200.

The residual decoding part 910 determines the prediction residual sequence E={e(1), e(2), . . . , e(N)} from the prediction residual code $C_e$ (S910). The coefficients decoding part 920 determines the quantized linear prediction coefficients K'={k'(1), k'(2), k'(P)} from the prediction coefficients code $C_k$ (S920). The predicted value calculation part 930 uses the decoded second signal sequence X and the quantized linear prediction coefficients K' to determine the second predicted value sequence Y according to the following formula (S930).

$$y(n) = \sum_{i=1}^{P} k'(i)x(n-i) \tag{6}$$

The predicted value sequence transformation part 430 performs a transformation that is an inverse of the transformation in step S250 (signal sequence inverse transformation step) on the second predicted value sequence Y by using the information t that indicates the number that does not occur to determine the transformed second predicted value sequence T(Y) (S430). The addition part 240 sums the transformed second predicted value sequence T(Y) and the prediction residual sequence E to determine the transformed second signal sequence T(X) (S240). The signal sequence inverse transformation part 250 transforms the transformed second signal sequence T(X) into the second signal sequence X={x(1), x(2), . . . , x(N)} by using the information t that indicates the number that does not occur in the case where there is a number that is included in the particular range but does not occur (S250).

The coding apparatus 300 and decoding apparatus 400 configured as described above have the same advantages as in the first embodiment.

[Third Embodiment]

Figure 15:
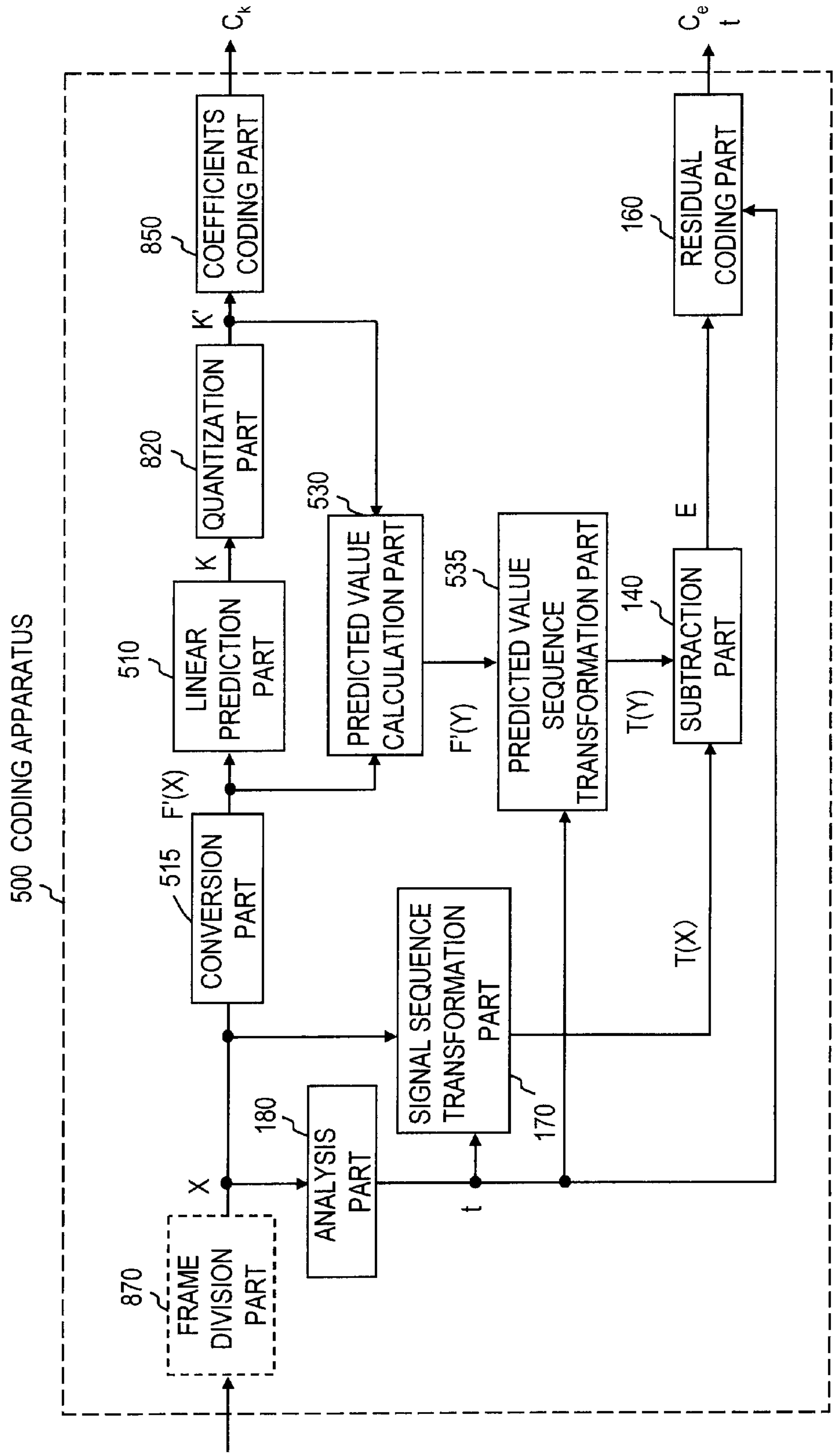
FIG. 15 is a diagram showing an exemplary functional configuration of a coding apparatus according to a third embodiment.
Figure 16:
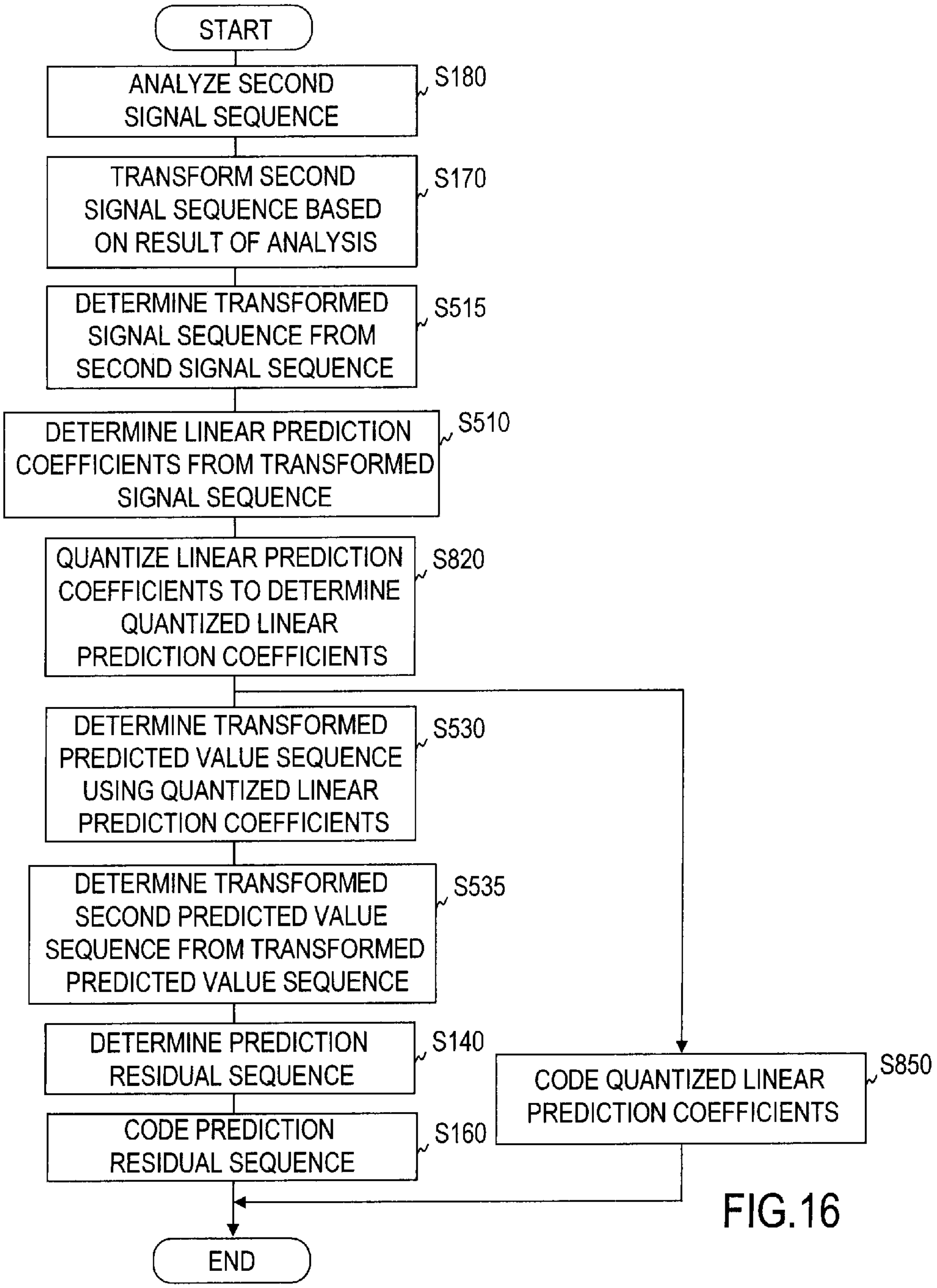
FIG. 16 shows an exemplary flow of a process performed by the coding apparatus according to the third embodiment.

FIG. 15 shows an exemplary functional configuration of a coding apparatus according to a third embodiment, and FIG. 16 shows an exemplary flow of a process performed by the coding apparatus according to the third embodiment. A coding apparatus 500 codes a number sequence (second signal sequence) as with the coding apparatus 100. The coding apparatus 500 comprises at least an analysis part 180, a signal sequence transformation part 170, a conversion part 515, a linear prediction part 510, a quantization part 820, a predicted value calculation part 530, a predicted value sequence transformation part 535, a subtraction part 140, a coefficients coding part 850, and a residual coding part 160. The analysis part 180, the signal sequence transformation part 170, the subtraction part 140 and the residual coding part 160 have the same functions as those of the coding apparatus 100.

When a second signal sequence X={x(1), x(2), . . . , x(N)} divided into frames is input to the coding apparatus 500, steps S180 and S170 are performed as with the coding apparatus 100. Then, the conversion part 515 converts the second signal sequence X according to a predetermined rule to determine a converted signal sequence F'(X) (S515). The second signal sequence X can be converted into the converted signal sequence F'(X) in various ways. For example, the second signal sequence X can be converted into a signal sequence in a linear relationship with the original signal sequence. For the μ-law according to ITU-T G.711 described in Non-patent literature 2, this means that the number "−127" is converted into the value <−8031>, the number "+127" is converted into the value <+8031>, and the numbers "+0" and "−0" are converted into the value <0>. Alternatively, although not yet published, Japanese Patent Application Nos. 2007-314032, 2007-314033, 2007-314034 and 2007-314035 disclose a method of conversion that relies on "a processing of bringing the second signal sequence close to a linear relationship with the original signal sequence".

The linear prediction part 510 performs a linear prediction analysis of the converted signal sequence F'(X) to determine linear prediction coefficients K={k(1), k(2), . . . , k(P)} (S510). In this expression, P represents a prediction order. The quantization part 820 quantizes the linear prediction coefficients K to determine quantized linear prediction coefficients K'={k'(1), k'(2), . . . , k'(P)} (S820). As an alternative to the processings in steps S510 and S820, the coding apparatus 500 may perform an equivalent processing using a table containing candidates k'(m, p) for the quantized linear prediction coefficients (where 1≤m≤M, and M is an integer equal to or greater than 2). In this case, the coding apparatus 500 can have a quantization/linear prediction part instead of the linear prediction part 510 and the quantization part 820. Then, the quantization/linear prediction part determines a predicted value sequence for the set of candidates k'(m, p) according to the formula (1) with X replaced with F'(X). Then, the quantized linear prediction coefficients K' for the converted signal sequence F'(X) can be determined by adopting, as the quantized linear prediction coefficients K', the set of candidates k'(m, p) for which the sum or absolute sum of the differences in power between the samples in the predicted value sequence and the corresponding samples in the converted signal sequence F'(X) is at minimum. The predicted value calculation part 530 uses the converted signal sequence F'(X) and the quantized linear prediction coefficients K' to determine a converted predicted value sequence F'(Y), which is a result of prediction of the converted signal sequence F'(X) (S530). In the case where the coding apparatus has the quantization/linear prediction part instead of the linear prediction part 510 and the quantization part 820, the predicted value calculation part 530 may be integrated into the quantization/linear prediction part. In this case, instead of the processing in step S530, the converted predicted value sequence F'(Y) can be determined by adopting, as the converted predicted value sequence F'(Y), a predicted value sequence corresponding to the quantized linear prediction coefficients K' previously determined by the quantization/linear prediction part. The predicted value sequence transformation part 535 performs a predetermined inverse transformation $F'^{-1}()$ on the converted predicted value sequence F'(Y) to determine the second predicted value sequence Y. Then, the predicted value sequence transformation part 535 transforms the second predicted value sequence Y in the same manner as that of transforming the second signal sequence X into a transformed second signal sequence T(X) in step S170 (signal sequence transformation step) and outputs the transformed second predicted value sequence T(Y) (S535). The subtraction part 140 determines the difference between the transformed second predicted value sequence T(Y) and the transformed second signal sequence T(X), that is, a prediction residual sequence E={e (1), e(2), e(N)} (S140). The coefficients coding part 850 codes the quantized linear prediction coefficients K' and outputs a prediction coefficients code $C_k$ (S850). The residual coding part 160 codes the prediction residual sequence E and outputs a prediction residual code $C_e$. In addition, the residual coding part 160 outputs information t that indicates a number that does not occur (S160).

In Non-patent literature 2 (G.711), specific examples in the cases of the A-law and the μ-law are shown by tables (Tables 1a to 2b in Non-patent literature 2). In Non-patent literature 2, both for the A-law and the μ-law, the sixth column in the tables shows the "8-bit form" (see FIG. 2), the seventh column shows the "quantized value of the original signal", and the eighth column shows the absolute value of the "number indicating the magnitude of the original signal (magnitude relationship among original signals)". Specifically, in Table 1a, a value shown in the eighth column is a "number indicating the magnitude of an original signal (the magnitude relationship among the original signals)". In Table 1b, a value shown in the eighth column negative-signed is a "number indicating the magnitude of an original signal (the magnitude relationship among the original signals)". The "8-bit form" is determined according to a rule that determines a bit form, such as a rule for inverting 0 and 1 bits. The numerical value restored from the 8-bit form according to the rule that determines the bit form is the "number indicating the magnitude of the original signal (the magnitude relationship among the original signals)". The "number indicating the magnitude of the original signal (the magnitude relationship among the original signals)" is equivalent to a sample value in the second signal sequence according to the present invention. The "quantized value of the original signal" in Non-patent literature 2 is equivalent to a sample value in the signal sequence in a linear relationship with the original signal sequence. For example, an 8-bit value "11101111" according to the μ-law corresponds to 16 as a number indicating the magnitude of the original signal (the magnitude relationship among the original signals) and to 33 as a quantized value of the original signal. Furthermore, an 8-bit value "10001111" according to the μ-law corresponds to 112 as a number indicating the magnitude of the original signal (the magnitude relationship among the original signals) and to 4191 as a quantized value of the original signal.

Figure 17:
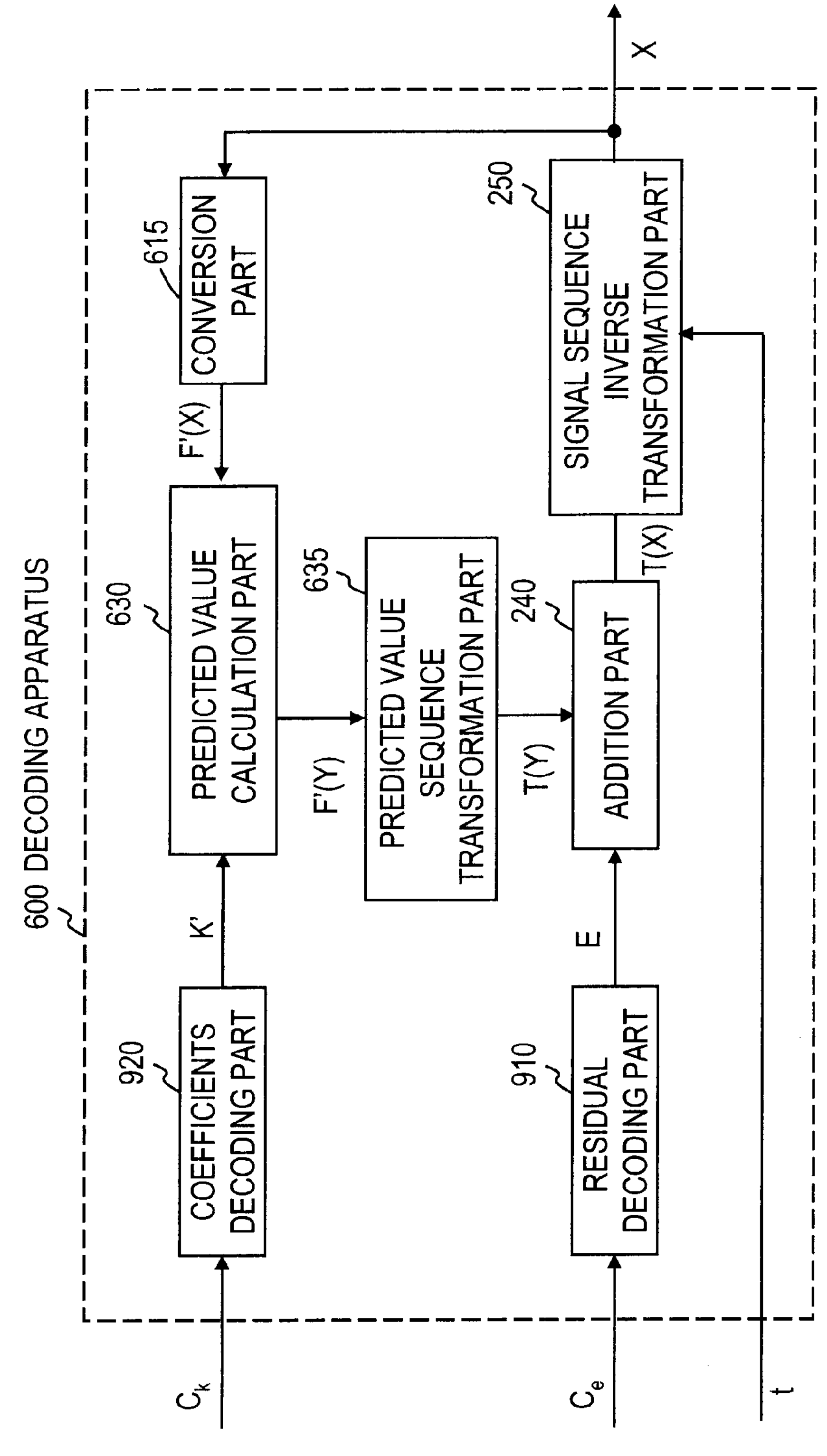
FIG. 17 is a diagram showing an exemplary functional configuration of a decoding apparatus according to the third embodiment.
Figure 18:
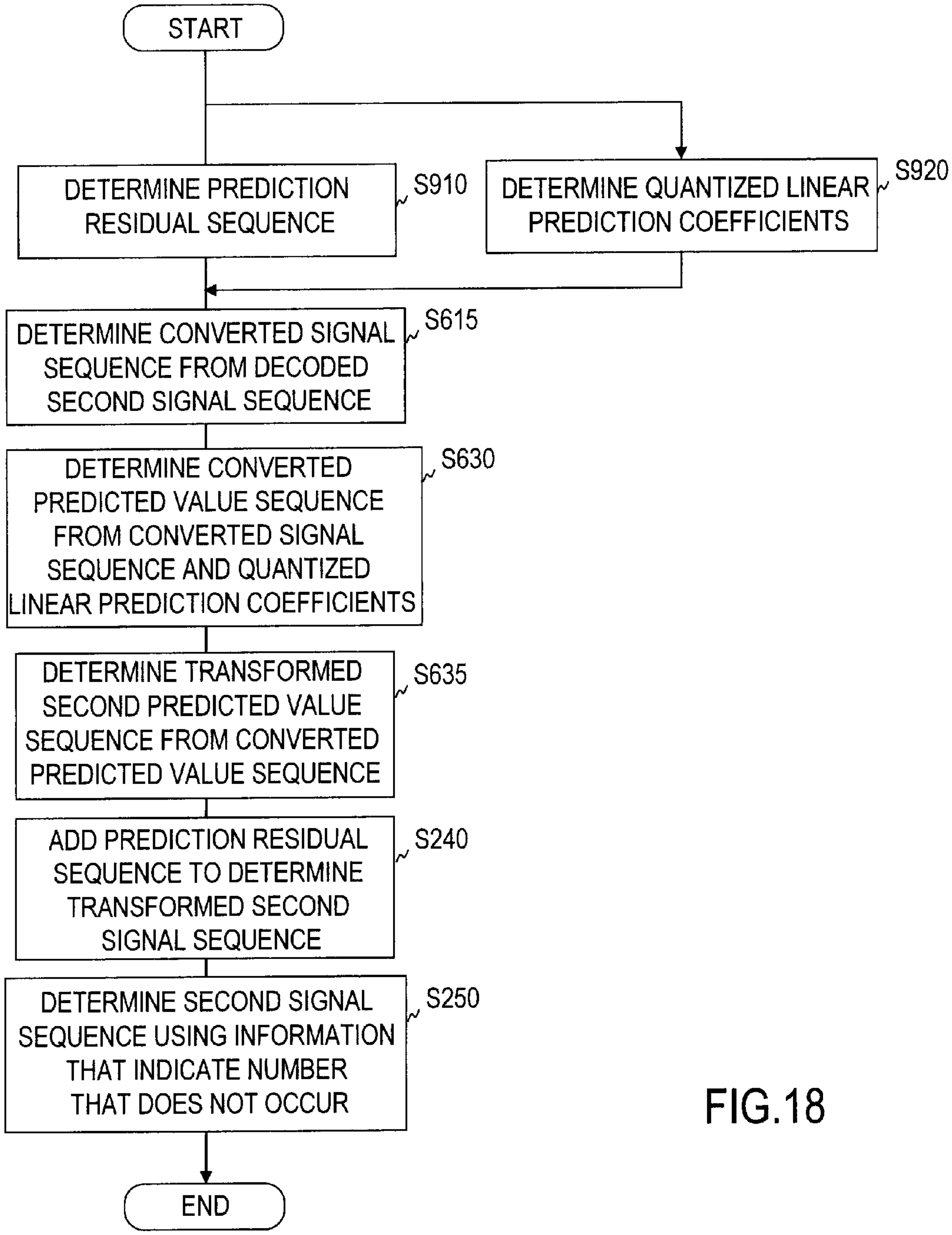
FIG. 18 shows an exemplary flow of a process performed by the decoding apparatus according to the third embodiment.

FIG. 17 shows an exemplary functional configuration of a decoding apparatus according to the third embodiment, and FIG. 18 shows an exemplary flow of a process performed by the decoding apparatus according to the third embodiment. A decoding apparatus 600 receives the prediction coefficients code $C_k$, the prediction residual code $C_e$ and the information t that indicates the number that does not occur. The decoding apparatus 600 decodes the codes into a number sequence (second signal sequence). The decoding apparatus 600 comprises a residual decoding part 910, a coefficients decoding part 920, a conversion part 615, a predicted value calculation part 630, a predicted value sequence transformation part 635, an addition part 240, and a signal sequence inverse transformation part 250. The addition part 240 and the signal sequence inverse transformation part 250 have the same functions as those of the decoding apparatus 200.

The residual decoding part 910 determines the prediction residual sequence E={e(1), e(2), . . . , e(N)} from the prediction residual code $C_e$ (S910). The coefficients decoding part 920 determines the quantized linear prediction coefficients K'={k'(1), k'(2), . . . , le(P)} from the prediction coefficients code $C_k$ (S920). The conversion part 615 converts the decoded second signal sequence X according to a predetermined rule to determine the converted signal sequence F'(X) (S615). The predicted value calculation part 630 uses a previous converted signal sequence F'(X) and the quantized linear prediction coefficients K' to determine the converted predicted value sequence F'(Y), which is a result of prediction of the converted signal sequence, according to the following formula (S630).

$$F'(y(n)) = \sum_{i=1}^{P} k'(i)F'(x(n-i)) \quad (7)$$

The predicted value sequence transformation part 635 performs a predetermined inverse transformation $F'^{-1}()$ on the converted predicted value sequence F'(Y) using the information t that indicates the number that does not occur to determine the second predicted value sequence Y. Then, the predicted value sequence transformation part 635 performs a transformation that is an inverse of the transformation in step S250 (signal sequence inverse transformation step) on the second predicted value sequence Y to determine the transformed second predicted value sequence T(Y) (S635). The addition part 240 sums the transformed second predicted value sequence T(Y) and the prediction residual sequence E to determine the transformed second signal sequence T(X) (S240). The signal sequence inverse transformation part 250 transforms the transformed second signal sequence T(X) into the second signal sequence X={x(1), x(2), . . . , x(N)} by using the information t that indicates the number that does not occur in the case where there is a number that is included in the particular range but does not occur (S250).

The coding apparatus 500 and decoding apparatus 600 configured as described above have the same advantages as in the first embodiment.

The present invention is not limited to the embodiments described above and can be advantageously applied to any coding method and decoding method that take the occurrence frequency into consideration, such as entropy coding.

SPECIFIC EXAMPLES

Next, referring to FIG. 19, transformation and conversion of a signal sequence performed in the signal sequence transformation part 170, the signal sequence inverse transformation part 250, the conversion part 515 and the predicted value sequence transformation part 535 will be described. In the following description, it is assumed that the calculation performed by the subtraction part 140 is defined as E=T(X)−T(Y), and the calculation performed by the addition part 240 is defined as T(X)=E+T(Y). The signals used as a specific example are those according to the μ-law defined in Tables 2a and 2b in Non-patent literature 2. The sixth column in Tables 2a and 2b in Non-patent literature 2 shows the "8-bit form", the seventh column shows the "quantized value of the original signal", and the eighth column shows the absolute value of the "number indicating the magnitude of the original signal (magnitude relationship among the original signals)". For Table 2a, the value shown in the eighth column is the "number indicating the magnitude of the original signal (magnitude relationship among the original signals)", and for Table 2b, the value shown in the eighth column negative-signed is the "number indicating the magnitude of the original signal (magnitude relationship among the original signals)". In FIG. 19, these columns are shown in the first to third columns. However, the "8-bit form" shown in FIG. 19 is expressed in the hexadecimal format. Note that, according to the μ-law, the bits "1" and "0" are inverted, and thus, "11111111" (expressed as 0xFF in FIG. 19) represents the minimum positive numerical value, and "10000000" (expressed as 0x80 in FIG. 19) represents the maximum positive numerical value. The numerical value restored from the expression according to the rule that determines the bit form is the "number indicating the magnitude of the original signal (the magnitude relationship among the original signals)". The "number indicating the magnitude of the original signal (the magnitude relationship among the original signals)" corresponds to the value of a signal in the second signal sequence X according to the present invention. And the "quantized value of the original signal" described in Non-patent literature 2 corresponds to the value of a signal in the signal sequence in a linear relationship with the original signal sequence.

The value of each signal in the second signal sequence X is the number shown in the third column in FIG. 19. Each signal in the second signal sequence X can assume "+0" or "−0", both of which indicate that the quantized value of the original signal is <0>. Some apparatus that generate the second signal sequence X output only one of "+0" and "−0". In addition, the second signal sequence X may not contain "+0" and "−0". For example, it is assumed that the analysis part 180 defines "+0" and "−0" as the particular range, checks whether or not there is a number that does not occur in the particular range, and outputs information t that indicates the number that does not occur. Since the second signal sequence X has only to be the "numbers indicating the magnitude of the original signals (magnitude relationship among the original signals)", the second signal sequence X may be the values shown in the fourth column in FIG. 19. In this case, the minimum positive amplitude value is "0", and the minimum negative amplitude value is "−1".

Based on the information t that indicates the number that does not occur, the signal sequence transformation part 170 renumbers as shown in the fourth, sixth, eighth and tenth columns in FIG. 19 and outputs the transformed second signal sequence T(X). Based on the information t that indicates the number that does not occur, the signal sequence inverse transformation part 250 performs a transformation that is an inverse of the transformation performed by the signal sequence transformation part 170. "No" in FIG. 19 indicates that the number corresponding to the number indicating the magnitude of the original signal (third column) does not occur in T(X).

The conversion part 515 converts the values shown in the third column in FIG. 19 into the values shown in the second column to determine the converted signal sequence F'(X), for example. This is the same as the example of the conversion described in the third embodiment.

The predicted value sequence transformation part 535 quantizes the converted predicted value sequence F'(Y) into the values shown in the second column and converts the values into the corresponding values in the third column (that is, performs the inverse conversion $F'^{-1}(\ )$), thereby determining the second predicted value sequence Y. Then, based on the information t that indicates the number that does not occur, the predicted value sequence transformation part 535 renumbers as shown in the fifth, seventh, ninth and eleventh columns in FIG. 19 and outputs the transformed second predicted value sequence T(Y) (S535). "No" in FIG. 19 indicates that the number corresponding to the number indicating the magnitude of the original signal (third column) does not occur in T(Y). As a result of this transformation, the amplitude of the residual signal sequence E is reduced, and thus, the coding efficiency is improved, compared with the case where the transformation is not performed.

FIG. 20 shows a specific example of the transformation and conversion in the case where the A-law is used. The sixth column in Tables 1a and 1b in Non-patent literature 2 shows the "8-bit form", the seventh column shows the "quantized value of the original signal", and the eighth column shows the absolute value of the "number indicating the magnitude of the original signal (magnitude relationship among the original signals)". That is, for Table 1a, the value shown in the eighth column is the "number indicating the magnitude of the original signal (magnitude relationship among the original signals)", and for Table 1b, the value shown in the eighth column negative-signed is the "number indicating the magnitude of the original signal (magnitude relationship among the original signals)". In FIG. 20, these columns are shown in the first, third and fourth columns. However, the "8-bit form" shown in FIG. 20 is expressed in the hexadecimal format. In the A-law, the 8-bit signal (the first column in FIG. 20) can successively assume "0", which indicates a silent state, which most frequently occurs. Thus, in many cases, the signal used in communication is in the form of the exclusive OR of the 8-bit signal in the A-law and 0x55 (which is equivalent to "01010101" in the binary expression). The second column in FIG. 20 shows the value of the exclusive OR of the 8-bit signal in the A-law and 0x55. The numerical value restored from the value in the first or second column according to the rule that determines the bit form is the "number indicating the magnitude of the original signal (the magnitude relationship among the original signals)". The "number indicating the magnitude of the original signal (the magnitude relationship among the original signals)" corresponds to the value of a signal in the second signal sequence X according to the present invention. And the "quantized value of the original signal" described in Non-patent literature 2 corresponds to the value of a signal in the signal sequence in a linear relationship with the original signal sequence.

The value of each signal in the second signal sequence X is the number shown in the fourth or fifth column in FIG. 20. In the case where the second signal sequence X is composed of the numbers shown in the fourth column, the minimum positive amplitude value is "+1", and the minimum negative amplitude value is "−1". In the case where the second signal sequence X is composed of the numbers shown in the fifth column, the minimum positive amplitude value is "0", and the minimum negative amplitude value is "−1".

Transformation and conversion of a signal sequence by the signal sequence transformation part 170, the signal sequence inverse transformation part 250, the conversion part 515 and the predicted value sequence transformation part 535 are performed as follows. Based on the information t that indicates the number that does not occur, the signal sequence transformation part 170 renumbers as shown in the fifth, seventh, ninth and eleventh columns in FIG. 20 and outputs the transformed second signal sequence T(X). However, in the case where the second signal sequence is composed of the values in the fifth column, T(X)=X. Based on the information t that indicates the number that does not occur, the signal sequence inverse transformation part 250 performs a transformation that is an inverse of the transformation performed by the signal sequence transformation part 170. "No" in FIG. 20 indicates that the number corresponding to the number indicating the magnitude of the original signal (fourth column) does not occur in T(X).

The conversion part 515 converts the values shown in the fourth column in FIG. 20 into the values shown in the third column to determine the converted signal sequence F'(X), for example. This is the same as the example of the conversion described in the third embodiment.

The predicted value sequence transformation part 535 quantizes the converted predicted value sequence F'(Y) into the values shown in the third column and converts the values into the corresponding values in the fourth (or fifth) column (that is, performs the inverse conversion $F'^{-1}(\ )$), thereby determining the second predicted value sequence Y. Then, based on the information t that indicates the number that does not occur, the predicted value sequence transformation part 535 renumbers as shown in the sixth, eighth, tenth and twelfth columns in FIG. 20 and outputs the transformed second predicted value sequence T(Y) (S535). "No" in FIG. 20 indicates that the number corresponding to the number indicating the magnitude of the original signal (fourth column) does not occur in T(Y). As a result of this transformation, the amplitude of the residual signal sequence E is reduced, and thus, the coding efficiency is improved, compared with the case where the transformation is not performed. The first to third embodiments have been described with regard to linear prediction. However, the prediction method may not be completely linear, and even when the prediction method is partially or totally nonlinear, the same advantages as those in the case of the linear prediction can be achieved. In the case where the prediction is not linear, the "linear prediction coefficients" described above can be replaced with the "prediction coefficients", the "linear prediction part" can be replaced with the "prediction part", and the "quantized linear prediction coefficients" can be replaced with the "quantized prediction coefficients".

Figure 21:
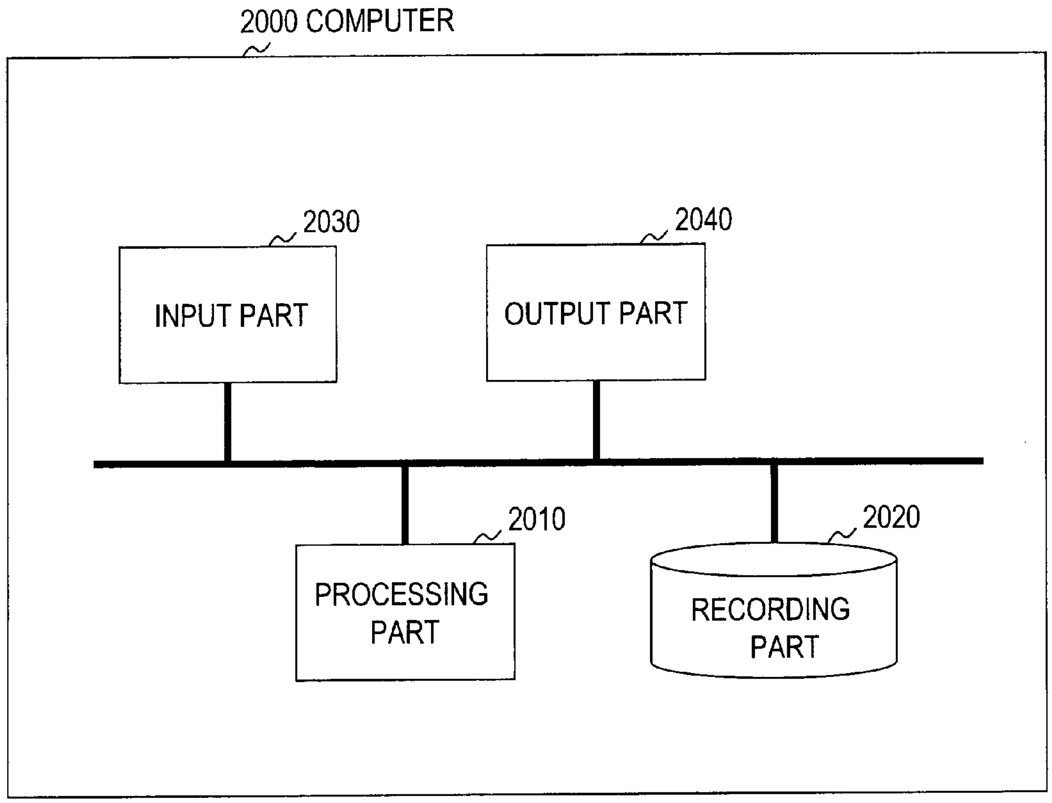
FIG. 21 is a diagram showing an exemplary functional configuration of a computer.

FIG. 21 shows an exemplary functional configuration of a computer. The coding method and the decoding method according to the present invention can be implemented by a computer 2000 by loading, to a recording part 2020 of the computer 2000, a program that makes the computer 2000 operate as a processing part 2010, an input part 2030, an output part 2040 and other components according to the present invention. The program can be loaded to the computer in various ways. For example, the program can be loaded to the computer from a computer-readable recording medium having prestored the program therein or loaded to the computer from a server or the like through a telecommunication line.

What is claimed is:

1. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a prediction analysis step of performing a prediction analysis of said transformed second signal sequence to determine prediction coefficients;

a quantization step of quantizing said prediction coefficients to determine quantized prediction coefficients;

a predicted value calculation step of determining a transformed second predicted value sequence, which is a result of prediction of the transformed second signal sequence, using a previous transformed second signal sequence and said quantized prediction coefficients;

a subtraction step of determining a prediction residual sequence between said transformed second predicted value sequence and said transformed second signal sequence;

a coefficients coding step of coding said quantized prediction coefficients; and a residual coding step of coding said prediction residual sequence.

2. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a prediction analysis step of performing a prediction analysis of said second signal sequence to determine prediction coefficients;

a quantization step of quantizing said prediction coefficients to determine quantized prediction coefficients;

a predicted value calculation step of determining a second predicted value sequence, which is a result of prediction of the second signal sequence, using a previous second signal sequence and said quantized prediction coefficients;

a predicted value sequence transformation step of transforming said second predicted value sequence in the manner of transforming the second signal sequence into the transformed second signal sequence in said signal sequence transformation step to determine a transformed second predicted value sequence;

a subtraction step of determining a prediction residual sequence between said transformed second predicted value sequence and said transformed second signal sequence;

a coefficients coding step of coding said quantized prediction coefficients; and a residual coding step of coding said prediction residual sequence.

3. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a conversion step of converting said second signal sequence according to a predetermined rule to determine a converted signal sequence;

a prediction analysis step of performing a prediction analysis of said converted signal sequence to determine prediction coefficients;

a quantization step of quantizing said prediction coefficients to determine quantized prediction coefficients;

a predicted value calculation step of determining a converted predicted value sequence, which is a result of prediction of the converted signal sequence, using said converted signal sequence and said quantized prediction coefficients;

a predicted value sequence transformation step of performing an inverse conversion according to said predetermined rule on said converted predicted value sequence to determine a second predicted value sequence, transforming the second predicted value sequence in the manner of transforming the second signal sequence into the transformed second signal sequence in said signal sequence transformation step, and outputting the transformed second predicted value sequence;

a subtraction step of determining a prediction residual sequence between said transformed second predicted value sequence and said transformed second signal sequence;

a coefficients coding step of coding said quantized prediction coefficients; and a residual coding step of coding said prediction residual sequence.

4. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a quantization prediction step of determining quantized prediction coefficients associated with said transformed second signal sequence and a prediction residual sequence, which is a residual of prediction of said transformed second signal sequence using said quantized prediction coefficients;

a coefficients coding step of coding said quantized prediction coefficients; and a residual coding step of coding said prediction residual sequence.

5. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a quantization prediction step of determining quantized prediction coefficients associated with said second signal sequence and a second predicted value sequence, which is a result of prediction of said second signal sequence using said quantized prediction coefficients;

a predicted value sequence transformation step of transforming said second predicted value sequence in the manner of transforming the second signal sequence into the transformed second signal sequence in said signal sequence transformation step to determine a transformed second predicted value sequence;

a subtraction step of determining a prediction residual sequence between said transformed second predicted value sequence and said transformed second signal sequence;

a coefficients coding step of coding said quantized prediction coefficients; and a residual coding step of coding said prediction residual sequence.

6. A coding method that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation step of in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a conversion step of converting said second signal sequence according to a predetermined rule to determine a converted signal sequence;

a quantization prediction step of determining quantized prediction coefficients associated with said converted signal sequence and a converted predicted value sequence, which is a result of prediction of said converted signal sequence using said quantized prediction coefficients;

a predicted value sequence transformation step of performing an inverse conversion according to said predetermined rule on said converted predicted value sequence to determine a second predicted value sequence, transforming the second predicted value sequence in the manner of transforming the second signal sequence into the transformed second signal sequence in said signal sequence transformation step, and outputting the transformed second predicted value sequence;

a subtraction step of determining a prediction residual sequence between said transformed second predicted value sequence and said transformed second signal sequence;

a coefficients coding step of coding said quantized prediction coefficients; and a residual coding step of coding said prediction residual sequence.

7. The coding method according to any one of claims 1 to 6, wherein a number sequence based on the μ-law according to the ITU-T G.711 corresponding to the positive minimum magnitude of quantized value is 0xFF and a number sequence based on the μ-law according to the ITU-T G.711 corresponding to the negative minimum magnitude of quantized value is a number 0x7F, in the hexadecimal expression, and a number sequence based on the A-law according to the ITU-T G.711 corresponding to the positive minimum magnitude of quantized value is 0x80 or 0xD5 and a number sequence based on the A-law according to the ITU-T G.711 corresponding to the negative minimum magnitude of quantized value is a number 0x00 or 0x55, in the hexadecimal expression.

8. A decoding method that decodes an input code into a number sequence, referred to as a second signal sequence hereinafter, comprising:

a residual decoding step of determining a prediction residual sequence from a prediction residual code;

a coefficients decoding step of determining quantized prediction coefficients from a prediction coefficients code;

a prediction value calculation step of determining a transformed second predicted value sequence, using the signal sequence decoded from a received code, referred to as a transformed second signal sequence hereinafter, and said quantized prediction coefficients, the transformed second predicted value sequence being a result of prediction of the transformed second signal sequence;

an addition step of summing said transformed second predicted value sequence and said prediction residual sequence to determine said transformed second signal sequence; and a signal sequence inverse transformation step of transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

9. A decoding method that decodes an input code into a number sequence, referred to as a second signal sequence hereinafter, comprising:

a residual decoding step of determining a prediction residual sequence from a prediction residual code;

a coefficients decoding step of determining quantized prediction coefficients from a prediction coefficients code;

a predicted value calculation step of determining a second predicted value sequence, which is a result of prediction of the second signal sequence, using the decoded second signal sequence and said quantized prediction coefficients;

a predicted value sequence transformation step of determining a transformed second predicted value sequence by performing, on said second predicted value sequence, an inverse transformation of a transformation performed in signal sequence inverse transformation step using information that indicates the number that does not occur;

an addition step of summing said transformed second predicted value sequence and said prediction residual sequence to determine a transformed second signal sequence; and a signal sequence inverse transformation step of transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

10. A decoding method that decodes an input code into a number sequence, referred to as a second signal sequence hereinafter, comprising:

a residual decoding step of determining a prediction residual sequence from a prediction residual code;

a coefficients decoding step of determining quantized prediction coefficients from a prediction coefficients code;

a conversion step of converting the decoded second signal sequence according to a predetermined rule to determine a converted signal sequence;

a predicted value calculation step of determining a converted predicted value sequence, which is a result of prediction of the converted signal sequence, using said converted signal sequence and said quantized prediction coefficients;

a predicted value sequence transformation step of determining a second predicted value sequence by performing an inverse transformation according to said predetermined rule on said converted predicted value sequence using information that indicates the number that does not occur and determining a transformed second predicted value sequence by performing, on the second predicted value sequence, an inverse transformation of the transformation performed in a signal sequence inverse transformation step;

an addition step of summing said transformed second predicted value sequence and said prediction residual sequence to determine a transformed second signal sequence; and a signal sequence inverse transformation step of transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

11. A coding apparatus that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation part in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a quantization prediction part determining quantized prediction coefficients associated with said transformed second signal sequence and a prediction residual sequence, which is a residual of prediction of said transformed second signal sequence using said quantized prediction coefficients;

a coefficients coding part coding said quantized prediction coefficients; and a residual coding part coding said prediction residual sequence.

12. A coding apparatus that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation part in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a quantization prediction part determining quantized prediction coefficients associated with said second signal sequence and a second predicted value sequence, which is a result of prediction of said second signal sequence using said quantized prediction coefficients;

a predicted value sequence transformation part transforming said second predicted value sequence in the manner of transforming the second signal sequence into the transformed second signal sequence in said signal sequence transformation part to determine a transformed second predicted value sequence;

a subtraction part determining a prediction residual sequence between said transformed second predicted value sequence and said transformed second signal sequence;

a coefficients coding part coding said quantized prediction coefficients; and a residual coding part coding said prediction residual sequence.

13. A coding apparatus that codes a number sequence based on the μ-law or the A-law according to the ITU-T G.711, referred to as a second signal sequence hereinafter, comprising:

letting a quantized value, a magnitude of which is 0 based on the μ-law according to the ITU-T G.711 or a magnitude of which is 1 based on to the A-law according to the ITU-T G.711, as a minimum quantized value, a signal sequence transformation part in a case where a number corresponding to a positive minimum magnitude of quantized value and a number corresponding to a negative minimum magnitude of quantized value occur in said second signal sequence, replacing the numbers in said second signal sequence with newly assigned numbers and outputting a number sequence formed thereby, referred to as a transformed second signal sequence hereinafter, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case where a number corresponding to a positive minimum magnitude of quantized value and a number corresponding to a negative minimum magnitude of quantized value do not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case where one of a number corresponding to a positive minimum magnitude of quantized value and a number corresponding to a negative minimum magnitude of quantized value does not occur in said second signal sequence, replacing the numbers in said second signal sequence with newly assigned numbers and outputting a number sequence formed thereby, referred to as a transformed second signal sequence hereinafter, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers;

a conversion part converting said second signal sequence according to a predetermined rule to determine a converted signal sequence;

a quantization prediction part determining quantized prediction coefficients associated with said converted signal sequence and a converted predicted value sequence, which is a result of prediction of said converted signal sequence using said quantized prediction coefficients;

a predicted value sequence transformation part performing an inverse conversion according to said predetermined rule on said converted predicted value sequence to determine a second predicted value sequence, transforming the second predicted value sequence in the manner of transforming the second signal sequence into the transformed second signal sequence in said signal sequence transformation part, and outputting the transformed second predicted value sequence;

a subtraction part determining a prediction residual sequence between said transformed second predicted value sequence and said transformed second signal sequence;

a coefficients coding part coding said quantized prediction coefficients; and a residual coding part coding said prediction residual sequence.

14. A decoding apparatus that decodes an input code into a number sequence, referred to as a second signal sequence hereinafter, comprising:

a residual decoding part determining a prediction residual sequence from a prediction residual code;

a coefficients decoding part determining quantized prediction coefficients from a prediction coefficients code;

a prediction value calculation part determining a transformed second predicted value sequence, using the signal sequence decoded from a received code, referred to as a transformed second signal sequence hereinafter, and said quantized prediction coefficients, the transformed second predicted value sequence being a result of prediction of the transformed second signal sequence;

an addition part summing said transformed second predicted value sequence and said prediction residual sequence to determine said transformed second signal sequence; and a signal sequence inverse transformation part transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

15. A decoding apparatus that decodes an input code into a number sequence, referred to as a second signal sequence hereinafter, comprising:

a residual decoding part determining a prediction residual sequence from a prediction residual code;

a coefficients decoding part determining quantized prediction coefficients from a prediction coefficients code;

a predicted value calculation part determining a second predicted value sequence, which is a result of prediction of the second signal sequence, using the decoded second signal sequence and said quantized prediction coefficients;

a predicted value sequence transformation part determining a transformed second predicted value sequence by performing, on said second predicted value sequence, an inverse transformation of a transformation performed in signal sequence inverse transformation part using information that indicates the number that does not occur;

an addition part summing said transformed second predicted value sequence and said prediction residual sequence to determine a transformed second signal sequence; and a signal sequence inverse transformation part transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

16. A decoding apparatus that decodes an input code into a number sequence, referred to as a second signal sequence hereinafter, comprising:

a residual decoding part determining a prediction residual sequence from a prediction residual code;

a coefficients decoding part determining quantized prediction coefficients from a prediction coefficients code;

a conversion part converting the decoded second signal sequence according to a predetermined rule to determine a converted signal sequence;

a predicted value calculation part determining a converted predicted value sequence, which is a result of prediction of the converted signal sequence, using said converted signal sequence and said quantized prediction coefficients;

a predicted value sequence transformation part determining a second predicted value sequence by performing an inverse transformation according to said predetermined rule on said converted predicted value sequence using information that indicates the number that does not occur and determining a transformed second predicted value sequence by performing, on the second predicted value sequence, an inverse transformation of the transformation performed in a signal sequence inverse transformation part;

an addition part summing said transformed second predicted value sequence and said prediction residual sequence to determine a transformed second signal sequence; and a signal sequence inverse transformation part transforming said transformed second signal sequence into said second signal sequence using information that indicates a number which does not occur, in the case where there is a number that does not occur, wherein said second signal sequence is a number sequence based on the μ-law or the A-law according to the ITU-T G.711, letting a quantized value, a magnitude of which is 0 based on the μ-law according to the ITU-T G.711 or a magnitude of which is 1 based on to the A-law according to the ITU-T G.711, as a minimum quantized value, said information that indicates the number which does not occur is information that indicates one of cases where a number corresponding to a positive minimum magnitude of quantized value and a number corresponding to a negative minimum magnitude of quantized value occur in said second signal sequence, a number corresponding to a positive minimum magnitude of quantized value and a number corresponding to a negative minimum magnitude of quantized value do not occur in said second signal sequence, and one of a number corresponding to a positive minimum magnitude of quantized value and a number corresponding to a negative minimum magnitude of quantized value does not occur in said second signal sequence, said transformed second predicted value sequence is in a case said information that indicates the number which does not occur indicates the case where a number corresponding to a positive minimum magnitude of quantized value and a number corresponding to a negative minimum magnitude of quantized value occur in said second signal sequence, a number sequence formed by replacing the numbers in said second signal sequence with newly assigned numbers, the newly assigned numbers corresponding to quantized values so that a positive maximum magnitude of quantized value corresponds to +127, a negative maximum magnitude of quantized value corresponds to −128 and relation in magnitude of the quantized values is maintained in the newly assigned numbers, in a case said information that indicates the number which does not occur indicates the case where a number corresponding to a positive minimum magnitude of quantized value and a number corresponding to a negative minimum magnitude of quantized value do not occur in said second signal sequence, a number sequence formed by replacing the numbers in said second signal sequence with newly assigned numbers, the newly assigned numbers corresponding to quantized values excluding the positive minimum magnitude of quantized value and the negative minimum magnitude of quantized value so that a positive maximum magnitude of quantized value corresponds to +126, a negative maximum magnitude of quantized value corresponds to −127 and relation in magnitude of the quantized values is maintained in the newly assigned numbers, in a case said information that indicates the number which does not occur indicates the case where one of a number corresponding to a positive minimum magnitude of quantized value and a number corresponding to a negative minimum magnitude of quantized value does not occur in said second signal sequence, a number sequence formed by replacing the numbers in said second signal sequence with newly assigned numbers, the newly assigned numbers corresponding to quantized values excluding the minimum magnitude of quantized value corresponding to said one number so that a positive maximum magnitude of quantized value corresponds to +127, a negative maximum magnitude of quantized value corresponds to −127 and relation in magnitude of the quantized values is maintained in the newly assigned numbers.

17. A computer-readable recording medium readable by a computer, on which a program for making the computer to execute each of the steps of the methods according to any one of claims 1 to 6 or 8 to 10.

* * * * *